United States Patent
Mathieu et al.

(10) Patent No.: US 7,458,816 B1
(45) Date of Patent: Dec. 2, 2008

(54) SHAPED SPRING

(75) Inventors: Gaetan L. Mathieu, Livermore, CA (US); Benjamin N. Eldridge, Danville, CA (US); Stuart W. Wenzel, Pleasanton, CA (US)

(73) Assignee: FormFactor, Inc., Livermore, CA (US)

( * ) Notice: Subject to any disclaimer, the term of this patent is extended or adjusted under 35 U.S.C. 154(b) by 0 days.

(21) Appl. No.: 09/547,561

(22) Filed: Apr. 12, 2000

(51) Int. Cl.
H01R 12/00 (2006.01)
(52) U.S. Cl. ........................................ 439/66
(58) Field of Classification Search ................ 439/66, 439/68, 70, 71, 83, 85, 161, 886, 79, 342; 438/14, 15, 17; 29/840, 842, 843, 846
See application file for complete search history.

(56) References Cited

U.S. PATENT DOCUMENTS

| | | | |
|---|---|---|---|
| 3,952,404 A | 4/1976 | Matunami | |
| 4,418,857 A | 12/1983 | Ainslie et al. | 228/124 |
| 4,553,192 A | 11/1985 | Babuka et al. | |
| 4,899,543 A | 2/1990 | Romanelli et al. | |
| 5,160,579 A | 11/1992 | Larson | |
| 5,307,311 A | 4/1994 | Sliwa, Jr. | |
| 5,476,211 A | 12/1995 | Khandros | 228/180.5 |
| 5,495,667 A | 3/1996 | Farnworth | |
| 5,613,861 A | 3/1997 | Smith et al. | 439/81 |
| 5,665,648 A | 9/1997 | Little | |
| 5,700,337 A | 12/1997 | Jacobs | |
| 5,772,451 A * | 6/1998 | Dozier, II et al. | 439/70 |
| 5,810,609 A * | 9/1998 | Faraci et al. | 439/71 |
| 5,829,128 A | 11/1998 | Eldridge et al. | |
| 5,832,601 A * | 11/1998 | Eldridge et al. | 29/843 |
| 5,848,685 A | 12/1998 | Smith et al. | 200/275 |
| 5,917,707 A | 6/1999 | Khandros et al. | 361/776 |
| 5,974,662 A | 11/1999 | Eldridge et al. | |
| 5,979,892 A * | 11/1999 | Smith | 271/267 |
| 5,983,493 A | 11/1999 | Eldridge et al. | |
| 6,029,344 A | 2/2000 | Khandros et al. | 29/874 |
| 6,043,563 A | 3/2000 | Eldridge et al. | |
| 6,150,186 A * | 11/2000 | Chen et al. | 438/14 |
| 6,183,267 B1 | 2/2001 | Marcus et al. | |
| 6,184,053 B1 | 2/2001 | Eldridge et al. | |
| 6,245,444 B1 | 6/2001 | Marcus et al. | 428/616 |
| 6,264,477 B1 | 7/2001 | Smith et al. | |

(Continued)

FOREIGN PATENT DOCUMENTS

DE 3604021 A1 8/1986

(Continued)

OTHER PUBLICATIONS

Weast, "Handbook Of Chemistry And Physics," pp. D-171 and D-172 (CRC Press).

(Continued)

Primary Examiner—Alexander Gilman
(74) Attorney, Agent, or Firm—N. Kenneth Burraston

(57) ABSTRACT

An interconnection element that includes a first element material adapted to be coupled to a substrate and a second element material comprising a material having a transformable property such that upon transformation, a shape of the interconnection is modified. An example is a material that has a transformable property such that a volume of the first and/or second element material may undergo a thermal transformation from one volume to a different volume (such as a smaller volume).

33 Claims, 15 Drawing Sheets

U.S. PATENT DOCUMENTS

| | | |
|---|---|---|
| 6,294,477 B1 | 9/2001 | Ho et al. |
| 6,306,671 B1 | 10/2001 | Silverbrook |
| 6,384,707 B2 | 5/2002 | Minners |
| 6,442,831 B1 | 9/2002 | Khandros et al. |
| 6,482,013 B2 | 11/2002 | Eldridge et al. |
| 6,640,432 B1 | 11/2003 | Mathieu et al. |
| 6,827,584 B2 | 12/2004 | Mathieu et al. |
| 7,127,811 B2 | 10/2006 | Mathieu et al. |
| 2001/0012704 A1 | 8/2001 | Eldridge |
| 2004/0038560 A1 | 2/2004 | Mathieu et al. |
| 2004/0102064 A1 | 5/2004 | Mathieu |
| 2007/0054513 A1 | 3/2007 | Mathieu et al. |

FOREIGN PATENT DOCUMENTS

| | | |
|---|---|---|
| JP | 61-136437 | 8/1986 |
| JP | 4-240570 | 8/1992 |
| JP | 9-213183 | 8/1997 |
| WO | WO 97/44676 | 11/1997 |
| WO | WO 98/52224 | 11/1998 |
| WO | WO 99/14404 | 3/1999 |
| WO | WO 00/03569 | 1/2000 |
| WO | WO 01/48870 | 2/2001 |
| WO | WO 01/48870 A2 | 2/2001 |

OTHER PUBLICATIONS

Weast, "Handbook of Chemistry and Physics," pp. D-171 and D-172 (CRC Press), 1976.

* cited by examiner

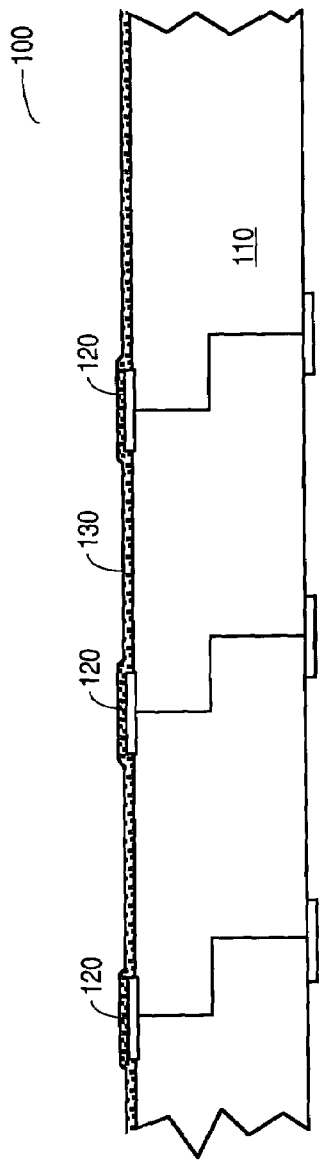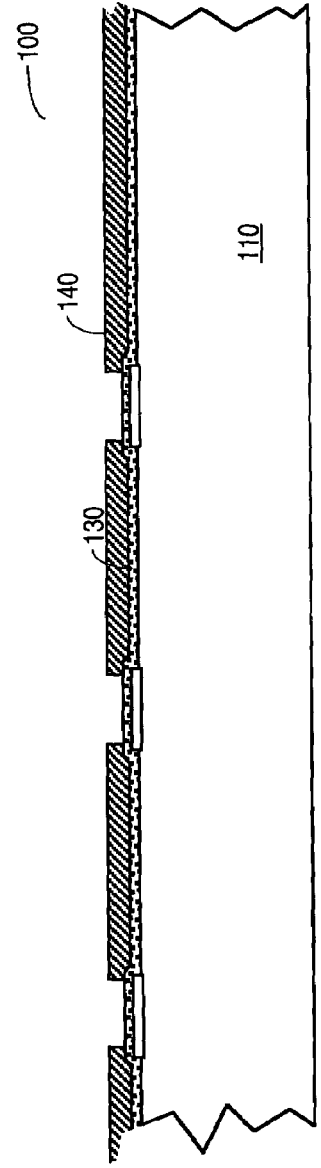

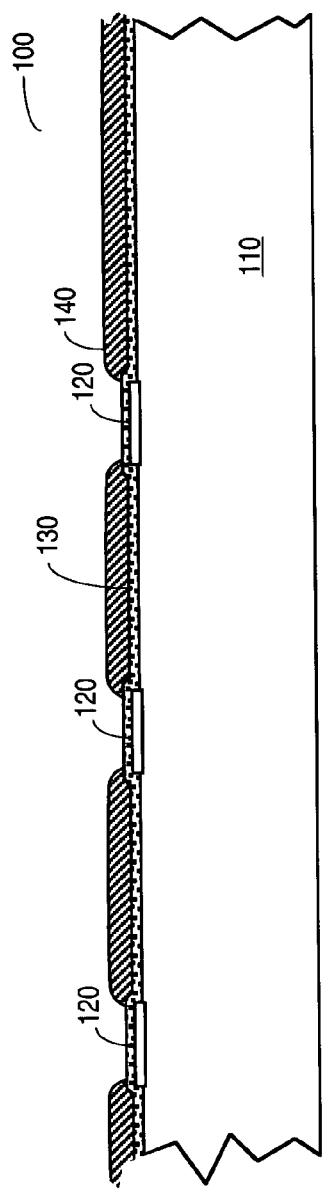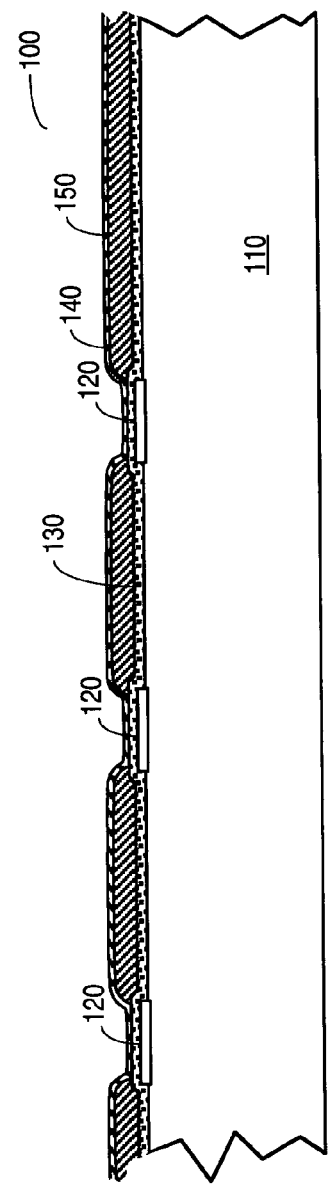

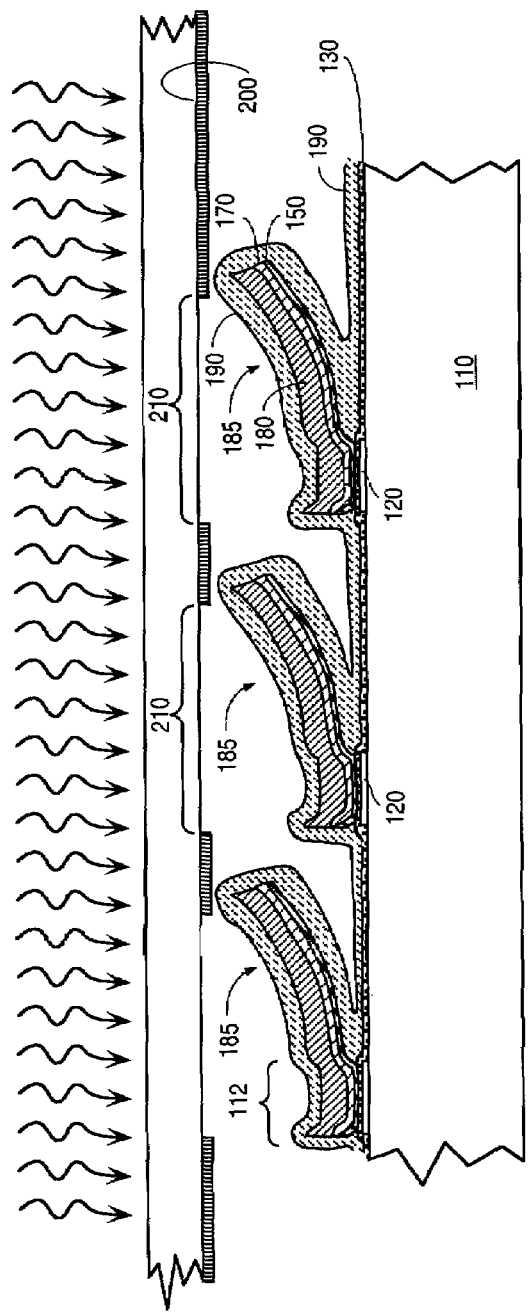
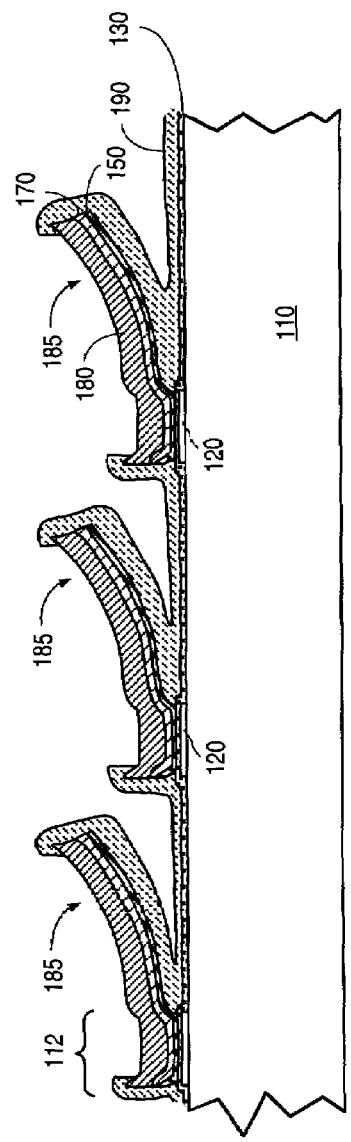

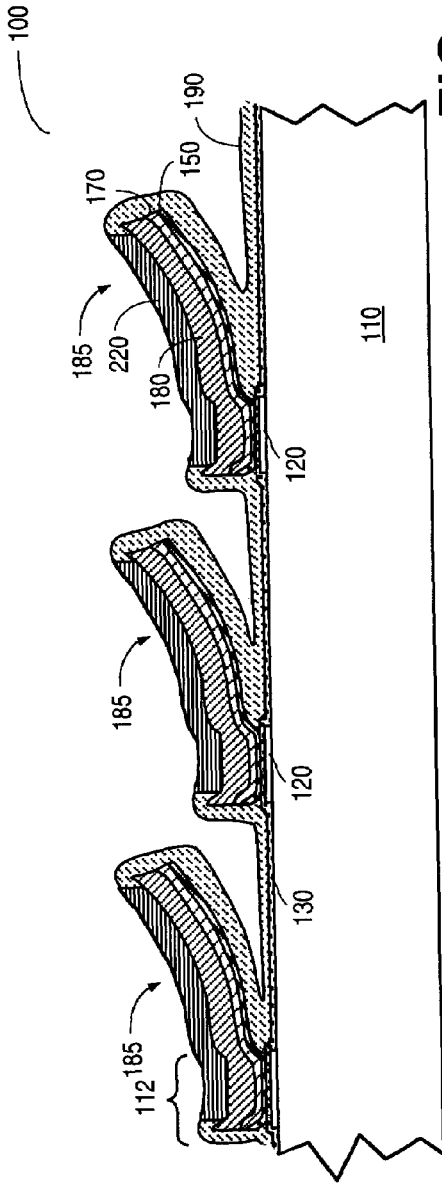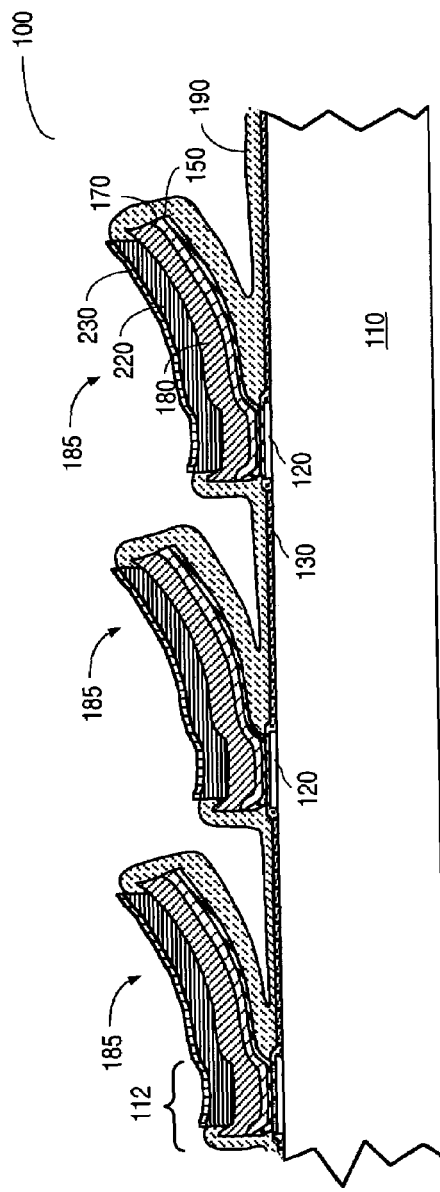

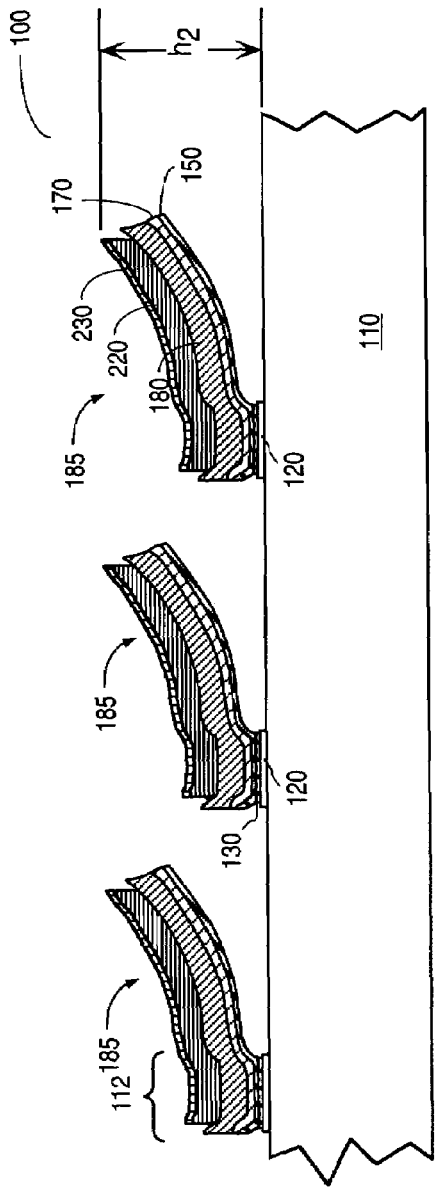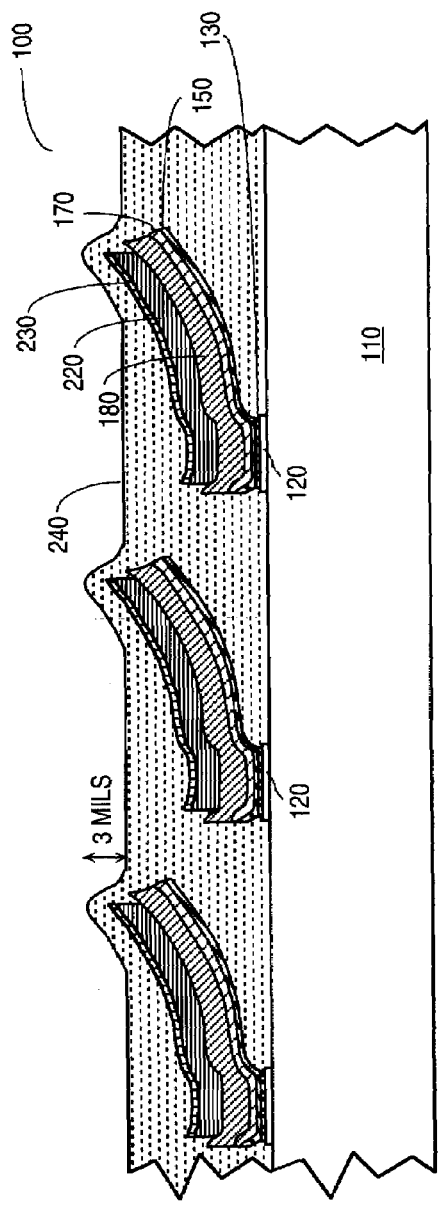

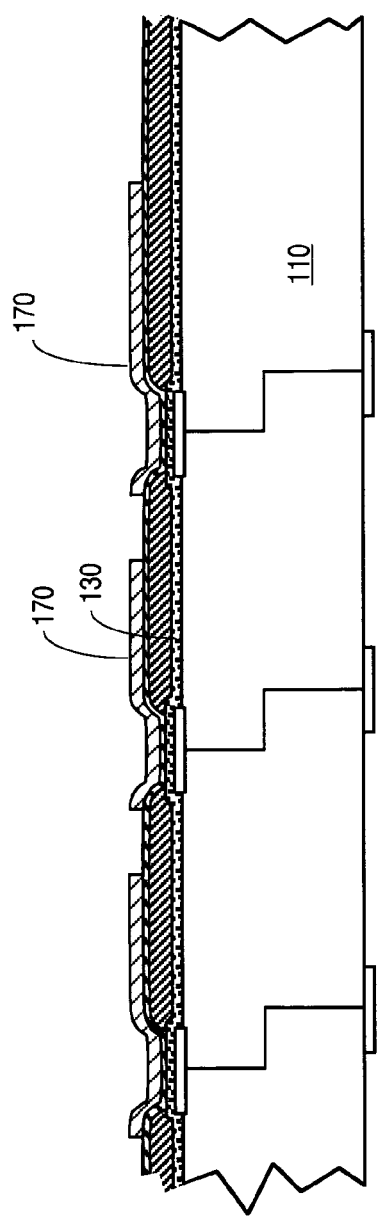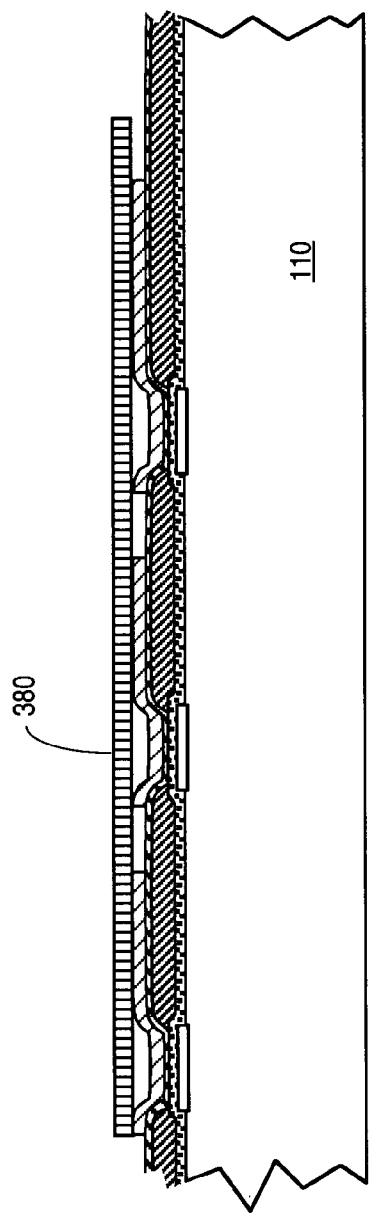

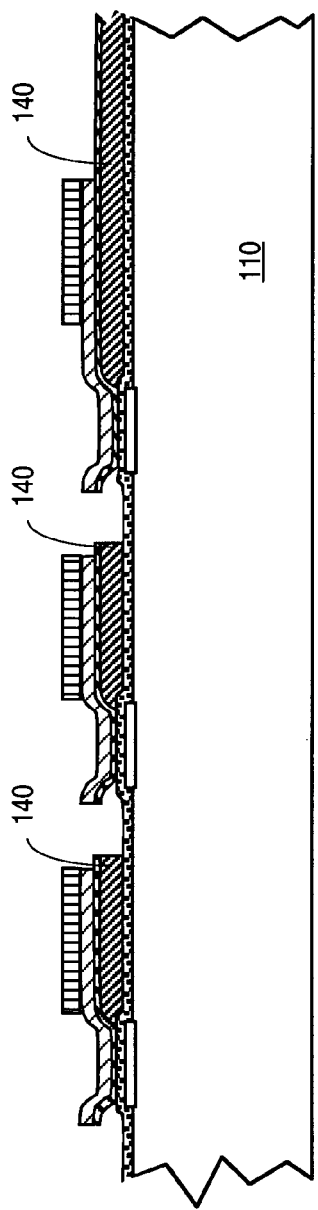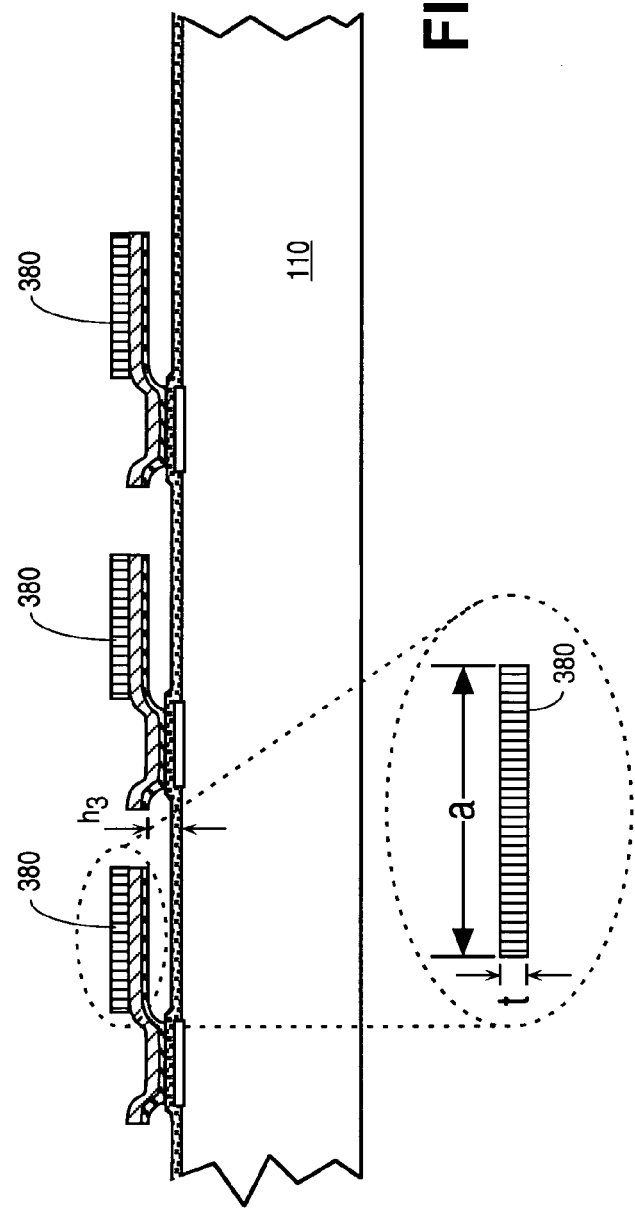

SHAPED SPRING

BACKGROUND OF THE INVENTION

1. Field of the Invention

The invention relates to an interconnection (contact) element suitable for effective connections between electronic components.

2. Description of Related Art

Interconnection or contact elements may be used to connect devices of an electronic component or one electronic component to another electronic component. For example, an interconnection element may be used to connect two circuits of an integrated circuit chip or to connect an application specific integrated circuit (ASIC). Interconnection elements may also be used to connect the integrated circuit chip to a chip package suitable for mounting on a printed circuit board (PCB) of a computer or other electronic device or to connect the integrated circuit chip directly to the PCB. Interconnection elements may further be used to connect the integrated circuit chip to a test device such as a probe card assembly or other substrate to test the chip.

Generally, interconnection or contact elements between electronic components can be classified into at least the two broad categories of "relatively permanent" and "readily demountable."

An example of a "relatively permanent" contact element is a wire bond. Once two electronic components are connected to one another by a bonding of an interconnection element to each electronic component, a process of unbonding must be used to separate the components. A wire bond interconnection element, such as between an integrated circuit chip or die and inner leads of a chip or package (or inner ends of lead frame fingers) typically utilizes a "relatively permanent" interconnection element.

One example of a "readily demountable" interconnection element is the interconnection element between rigid pins of one electronic component received by resilient socket elements of another electronic component, for example, a spring-loaded LGA socket or a zero-insertion force socket. A second type of a "readily demountable" interconnection element is an interconnection element that itself is resilient or spring-like or mounted in or on a spring or resilient medium. An example of such an interconnection element is a tungsten needle or a micro-spring contact of a probe card component such as described in commonly assigned U.S. Pat. No. 5,974,662, titled "Method of Planarizing Tips of Probe Elements of a Probe Card Assembly," issued Nov. 2, 1999 (FFI-P06). The interconnection element of a probe card component is typically intended to effect a temporary pressure connection between an electronic component to which the interconnection element is mounted and terminals of a second electronic component, such as a semiconductor device under test.

With regard to spring interconnection elements, generally, a minimum contact force is desired to effect reliable pressure contact to an electronic component (e.g., to terminals of an electronic component). For example, a contact (load) force of approximately 15 grams (including as little as 2 grams or less and as much as 150 grams or more, per terminal) may be desired to effect a reliable electrical pressure connection to a terminal of an electronic component.

A second factor of interest with regard to spring interconnection elements is the shape and metallurgy of the portion of the interconnection element making pressure connection to the terminal of the electronic component. With respect to the tungsten needle as a spring interconnection element, for example, the contact end is limited by the metallurgy of the element (i.e., tungsten) and, as the tungsten needle becomes smaller in diameter, it becomes commensurately more difficult to control or establish a desired shape at the contact end.

In certain instances, interconnection elements themselves are not resilient, but rather are supported by a resilient membrane. Membrane probes exemplify this situation, where a plurality of microbumps are disposed on a resilient membrane. Again, the technology required to manufacture such contact elements limits the design choices for the shape and metallurgy of the contact portion of the contact elements.

Commonly-assigned U.S. patent application Ser. No. 08/152,812, filed Nov. 16, 1993 (now U.S. Pat. No. 5,476,211, issued Dec. 19, 1995) (FFI-P01), discloses methods for making spring interconnection elements. In a preferred embodiment, these spring interconnection elements, which are particularly useful for micro-electronic applications, involve mounting an end of a flexible elongate element (e.g., wire "stem" or "skeleton," sometimes "core") to a terminal on an electronic component, and coating the flexible element and adjacent surface of the terminal with a "shell" of one or more materials. One of skill in the art can select a combination of thickness, yield strength, and elastic modulus of the flexible element and shell materials to provide satisfactory force-to-deflection characteristics of the resulting spring interconnection elements. Exemplary materials for the core element include gold. Exemplary materials for the coating include nickel and its alloys. The resulting spring interconnection element is suitably used to effect pressure, or demountable, interconnections between two or more electronic components, including semiconductor devices.

As electronic components get increasingly smaller and the spacing between terminals on the electronic components get increasingly tighter (the pitch gets increasingly finer), it becomes increasingly more difficult to fabricate interconnections suitable for making electrical connection to terminals of an electronic component. Co-pending and commonly-assigned U.S. patent application Ser. No. 08/802,054, filed Feb. 18, 1997, titled "Microelectronic Contact Structure, and Method of Making Same" (FFI-P34) (incorporated herein in full by reference), and corresponding PCT application published Nov. 27, 1997 as WO97/44676, disclose a method of making spring interconnection elements through lithographic techniques. In one embodiment, that application discloses forming a spring interconnection element (including a spring interconnection element that is a cantilever beam) on a sacrificial substrate and then transferring and mounting the interconnection element to a terminal on an electronic component. In that disclosure, the spring interconnection element is formed in the substrate itself through etching techniques. In co-pending, commonly-assigned U.S. patent application Ser. No. 08/852,152, filed May 6, 1997 (now U.S. Pat. No. 6,184,053), titled "Method of Making Microelectronic Spring Contact Elements" (FFI-P35), spring interconnection elements are formed on a substrate, including a substrate that is an electronic component, by depositing and patterning a plurality of masking layers to form an opening corresponding to a shape embodied for the spring interconnection element, depositing conductive material in the opening made by the patterned masking layers, and removing the masking layer to form the free-standing spring interconnection element.

Co-pending and commonly-assigned U.S. patent application Ser. No. 09/023,859, titled "Microelectronic Contact Structures and Methods of Making Same" (FFI-P047) describes an interconnection element having a base end portion (post component), a body portion (beam component) and a contact end portion (tip component) and methods of separately forming each portion and joining the post portion together as desired on an electronic component.

U.S. Pat. No. 5,613,861 (and its counterpart divisional U.S. Pat. No. 5,848,685) issued to Smith et al. disclose photolithographically patterned spring interconnection elements formed on a substrate with a body having an inherent stress gradient formed of a resilient (e.g., elastic) material such as chrome-molybdenum alloy or a nickel-zirconium alloy. The stress gradient causes an end of the body to bend away from the substrate in the shape of an arc when the end is freed from the substrate.

In order to achieve the desired shape of the body, Smith et al. must limit the thickness of the interconnection element described in U.S. Pat. No. 5,613,861. A limit on the thickness of the interconnection element limits the spring constant, k, of the interconnection element (k increases as thickness increases) particularly in state-of-the-art interconnection element arrays where the dimensions (e.g., length and width) of individual interconnection arrays are reduced to accommodate a corresponding increase in contact pad or terminal density. A reduction of the spring constant generally reduces the amount of load or force, F, that may be applied to resilient interconnection elements for a given deflection, x ($k=F/x$). Thus, such interconnection elements generally sustain at best a moderate contact force, which may not be enough to effect reliable pressure contact to an electronic component.

What is needed is a resilient interconnection element and a method of improving the resiliency of an interconnection element, particularly interconnection elements that are suitable for present fine-pitch electrical connections and that is/are scalable for future technologies. Also needed are improved methods of making resilient interconnection elements, particularly methods that are repeatable, consistent, and inexpensive.

SUMMARY OF THE INVENTION

An interconnection element is disclosed. In one embodiment, the interconnection element includes a first element material adapted to be coupled to a substrate and a second element material coupled to the first element material. At least one of the first element material and the second element material comprises a material having a transformable property such that upon transformation, a shape of the interconnection element is deformed. One example is a first and/or second element material having a property such that a first volume of the material is adapted to be transformed to a second, different volume.

One portion of the interconnection element of the invention may be coupled to a substrate such as an electronic component and in electrical communication with a signal at the substrate. The interconnection element may adopt a variety of configurations to allow elastic deformation when interconnecting two electronic components. One preferred embodiment is a configuration of a cantilever where a free end of the interconnection element is available for electrical connection, such as to probe contact pads or terminals of another electronic component or electrically couple two electronic components.

In one aspect of the invention, the first element material and the second element material of the interconnection element are arranged in a configuration such that the second element material overlies the first element material and the first volume is greater than the second volume. In such case, the transformation to a smaller second volume causes the interconnection element to deform along some portion of its length. In the example where the interconnection element adopts a cantilever configuration on a substrate, the volume transformation will cause, in one embodiment, the free end of the interconnection element to deform away (i.e., deflect) from the substrate with the free end arcing toward the coupled base, thus providing a projecting interconnection element. The distance that an interconnection may deflect from the substrate may be limited by, for example, a travel stop so that, in one instance, a consistent deflection distance may be established for a plurality of interconnection elements on a substrate (or above the substrate). Once the shape of the interconnection element is deformed, the second element material may be retained or removed, to yield a bi-material or mono-material interconnection element, respectively.

By providing an interconnection element of a material that undergoes a property transformation to deform the interconnection element, the fabrication of interconnection elements on a substrate may be simplified over prior art methods. The bi-material or mono-material interconnection element may also serve as a precursor or core to a final interconnection structure, the final structure formed by incorporating additional materials or layers, e.g., resilient layers, to form the interconnection element.

An electronic assembly is also disclosed. In one embodiment, the electronic assembly includes a substrate having a plurality of contact nodes accessible on the substrate and a plurality of free-standing resilient interconnection elements coupled to the substrate in such a manner that an attachment element or a base of an interconnection element electrically contacts a corresponding one of the contact nodes. In another embodiment, the contact nodes are signal lines on or in the substrate. The interconnection element comprises, in one aspect, a first element material adapted to be coupled to a substrate, and a second element material coupled to the first element material. One of the first element material and the second element material comprises a material having a transformable property such that upon transformation, a shape of the interconnection element is deformed. One example is a first and/or second element material having a property such that a first volume of the material is adapted to be transformed to a different second volume.

A method is further disclosed. The method includes creating an interconnection element coupled to a substrate and comprising a first element material and a second element material; releasing the interconnection element from the substrate at one end; and transforming a property of one of the first element material and the second element material to deform the interconnection element. One example of a property transformation is transforming the volume of one of the first element material and the second element material from a first volume to a second, different volume. In one embodiment, the release of the one end of the interconnection element may occur before or after the transformation step.

In one aspect, the interconnection element may adopt a variety of configurations such as a cantilever where a free end of the interconnection element is available for electrical connection, such as to probe or electrically couple an electronic assembly. The second element material may overly the first element material such that, in one embodiment, a volume transformation, for example, results in the second volume being less than the first volume. In the case of a cantilever interconnection element, the free end of the interconnection element may deform upon transformation to move the free end of the contact away from the substrate. Following the transformation, the second element material may be removed to create a mono-material interconnection element. This latter operation is particularly useful where the remaining material is in a state where it will retain, at least more or less, the modified shape.

The interconnection element formed by the method of the invention may stand alone or may serve as a precursor to a final interconnection structure. In one embodiment, the method includes, after the transformation step, patterning a masking material over the substrate to have an opening exposing the surface of the interconnection element and coating a third element material, such as a resilient material, on the exposed surface of the interconnection element to increase the spring constant of the interconnection element. One suitable masking material is an electrophoretic resist material that may be introduced onto the surface of the substrate. One advantage of using the electrophoretic resist material as the masking material is that it may be introduced uniformly over the surface without disrupting (e.g., damaging) the interconnection element or elements on the substrate.

Products including the new contact elements can be secured to a second electronic component by means of pressure, as in a holding fixture or a probing apparatus for testing wafers. Products also can be secured more permanently, as by soldering, much as in conventional mounting of ICs to system boards.

Additional features, embodiments, and benefits will be evident in view of the figures and detailed description presented herein.

BRIEF DESCRIPTION OF THE DRAWINGS

The features, aspects, and advantages of the invention will become more thoroughly apparent from the following detailed description, appended claims, and accompanying drawings in which:

FIG. 1 illustrates a cross-sectional side view of a portion of an electronic component having a plurality of contact pads with a shorting layer over the pads.

FIG. 2 illustrates the structure of FIG. 1 after the patterning of a masking material over the substrate and having openings to the plurality of contact pads according to a first embodiment of the invention.

FIG. 3 shows the structure of FIG. 1 after a thermal treatment.

FIG. 4 shows the structure of FIG. 1 after the conformal introduction of an activation layer over the top surface of a structure.

FIG. 13 shows the structure of FIG. 1 defining the third masking material.

FIG. 14 shows the structure of FIG. 1 after the definition of the third masking material to have an opening to the second element material.

FIG. 15 shows the structure of FIG. 1 after the introduction of third element material over the exposed portions of the second element material.

FIG. 16 shows the structure of FIG. 1 after the introduction of a probe material over the third element material.

FIG. 17 shows the structure of FIG. 1 after the removal of the third masking material.

FIG. 18 shows the structure of FIG. 1 after the introduction of travel stop material.

FIG. 22 illustrates a cross-sectional side view of a portion of an electronic component having a shorting layer over contact pads, a masking material over the shorting layer, an activation layer over the masking material, and first element material introduced and patterned over the activation layer in accordance with another embodiment of the invention.

FIG. 23 shows the structure of FIG. 22 after the introduction of a shape memory alloy (SMA) material in a martinsite state over the patterned first element material.

FIG. 24 shows the structure of FIG. 22 after the patterning of the SMA material.

FIG. 25 shows the structure of FIG. 22 after the removal of the first element material.

DETAILED DESCRIPTION OF THE INVENTION

Figure 5:
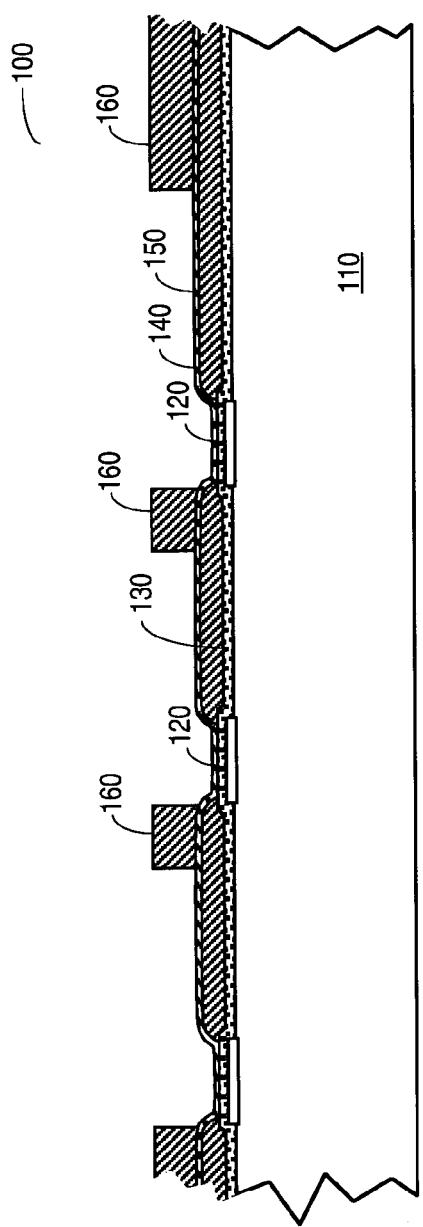
FIG. 5 shows the structure of FIG. 1 after the patterning of a second masking material over the top surface of a structure.

The invention relates to interconnection elements, including contact elements. According to one aspect of the invention, at least initially, an interconnection element includes at least two materials and one or both of the materials is adapted to undergo a transformation to deform the shape of the interconnection element. One example is a volume transformation of at least one of the materials from a first volume to a second, different volume, the volume transformation bringing about a change in the shape of the interconnection element. One advantage of the interconnection element of the invention is that such a structure may be formed with the desired shape, resilience, and spring constant according to a simplified technique.

In this manner, the invention describes an interconnection element having improved characteristics over prior art interconnection elements thus improving the suitability of the interconnection element of the invention for use in present and future, reduced-sized applications, including providing a conductive path between electronic components such as in contacting and/or testing of contact pads or terminals of an electronic component.

The following discussion describes the transformation (e.g., volume transformation) of at least one of two interconnection materials to deform (e.g., modify) the shape of the interconnection element. In terms of at least a two material structure wherein a second material overlies a first material, several transformation scenarios are possible. Such scenarios include, but are not limited to, a second element material that undergoes a volume transformation to a smaller volume; a first element material that undergoes a volume transformation to a larger volume; a first element material and a second element material (and possibly additional materials) that each undergo a volume transformation to deform an interconnection element; and two materials with different stress properties that will deform the shape of an interconnection element, for example, through a heat treatment. In general, the behavior of metallic materials under temperature changes is understood in the art and the invention capitalizes on this behavior in designing interconnection elements with improved resiliency and spring constants in a simplified manner.

In the embodiments that follow, suitable electronic components include, but are not limited to, an active semiconductor device; a memory chip; a portion of a semiconductor wafer including a semiconductor wafer or die, made of any suitable semiconductor material such as silicon (Si) or gallium arsenide (GaAs); a ceramic substrate; an organic substrate; a printed circuit board (PCB); an organic membrane; a polyimide sheet; a space transformer; a probe card; a chip carrier; a production interconnect socket; a test socket; a sacrificial member; a semiconductor package including, but not limited to, ceramic and plastic packages and chip carriers; and a connector. The electronic component may be an active device or a passive device that supports one or more electronic connections. In general, suitable electronic components include, but are not limited to, devices comprising an integrated circuit having at least two contact pads or terminals providing electrical access to the circuit. Such a device is representatively demonstrated by an integrated circuit chip (or micro-chip) having a plurality of exposed contact pads or terminals providing access to the integrated circuit of the device.

The interconnection element of the invention may be fabricated on or independent of the electronic component to which it is joined. In the case of independent fabrication, the invention contemplates that the interconnection element or elements can be fabricated with a shape, size, and metallurgy that are not limited by the materials and layout considerations associated with the manufacture of the electronic component. Independent fabrication also avoids the exposure of the electronic component to the process conditions associated with forming the interconnection element. In the case of fabricating directly on the substrate, the invention contemplates that the interconnection elements can be formed directly on contacts or terminals on the substrate, thus reducing transferring operations and reducing alignment issues.

Disposed on an electronic component such as a space transformer of a probe card assembly, the interconnection elements of the invention are designed to accommodate contact pads or terminals of electronic components having very small pitch or spacing tolerances. In one embodiment, the interconnection elements of the invention adopt alternating orientation (e.g., left-right-left-right) so as to achieve a greater pitch between their post portions than between their tip portions. In another embodiment, the interconnection elements of the invention adopt alternating lengths (e.g., short-long-short-long) so as to achieve a greater pitch between a post or anchor portion than at the tip portion of adjacent interconnection elements. Similarly, alternating interconnection elements can be fabricated to have a greater pitch at their tip portions than their post or anchor portions. In summary, the interconnection elements, whether fabricated on or independent of the electronic component to which they are joined may adopt a variety of orientations to accommodate various configurations associated with the electronic components to which they contact.

FIG. 1 shows a cross-sectional side view of electronic component or structure 100. Structure 100 is, for example, a space transformer of a probe card assembly or an integrated circuit. Structure 100 includes, in this example, semiconductor-, organic-, metal-, or ceramic-based substrate 110 having contact pads or terminals 120 on a surface of substrate 110. In the case of a commercially available ceramic-based electronic component (e.g., a multi-layer ceramic substrate such as a low-temperature, co-fired ceramic (LTCC) substrate), structure 100 may contain corresponding contact pads or terminals 121 on opposing surfaces of substrate 110. Corresponding contact pads or terminals 121 on opposing surfaces are connected, for example, through conductive circuit 119 running through substrate 110 such as, for example, a circuit of molybdenum, copper, gold, nickel, or tungsten and aluminum or combination of these materials or their alloys or other conductive element and its alloys. Details of materials, thickness, processing variations and the like can be found in co-pending, commonly-owned U.S. patent application Ser. No. 09/032,473, filed Feb. 26, 1998, titled "Lithographically Defined Microelectronic Contact Structures" (FFI-P048), and PCT equivalent published as WO98/52224 on Nov. 9, 1998, both of which are incorporated herein by reference.

Contact pads or terminals 120 on substrate 110 are, for example, copper, nickel, and gold that may be suitable for connecting to an interconnection element formed to the deposition of a conductive material by, for example, sputtering, electroplating or soldering. In one example, the copper facilitates the electroplating process and is the upper layer.

In this embodiment, overlying substrate 110 of structure 100 is shorting layer 130. Shorting layer 130 is, for example, a copper (Cu), titanium (Ti) or titanium-tungsten (Ti—W) or other appropriate metal or alloy that serves, in one sense, to short contact pads or terminals 120 during the formation of interconnection elements on substrate 110. As will become evident from the description that follows, the shorting feature of shorting layer 130 can advantageously be employed to establish an appropriate potential for an electrolytic process (e.g., an electroplating process) for fabricating interconnection elements on substrate 110. It is to be appreciated that an electrolytic process is one technique for forming the interconnection elements of the invention, and that other techniques may also be suitable, such as chemical or sputter deposition or electroless plating processes. It is to be appreciated that the operations indicated can be carried out either simultaneously or sequentially on both surfaces of substrate 110, to create a "double-sided" spring device. In this case, re-distributions and a non one-to-one relationship may exist between contact structures and/or interconnection elements on opposing surfaces.

In one embodiment, shorting layer 130 is introduced to a thickness of about 3000 Å to 6000 Å, such as about 5000 Å over a surface of substrate 110 by, for example, sputtering. One alternative may be to introduce shorting layer 130 over the opposite side of substrate 110 to short contact pads or terminals 121 that extend through substrate 110.

FIG. 2 shows structure 100 after the deposition of first masking material layer 140 over the surface of substrate 110. In one embodiment, first masking material layer 140 is a photoresist that is spin-coated on the surface of substrate 110 and patterned as known in the art. First masking material layer 140 is deposited and patterned to include openings. The openings may be located at a position that is directly over a portion of contact pads or terminals 120 or, in some cases, may be located at a position that is remote from contact pads or terminals 120. By locating openings at a position remote from the contact pads or terminals, interconnection elements can be fabricated on an electronic component with a layout that differs from that of the contact pads or terminals of the electronic component. An example of specifics for re-routing the contact pads or terminals are described in co-pending U.S. patent application Ser. No. 08/955,001, filed Oct. 20, 1997, titled "Electronic Component Having Resilient Contact Elements at Areas Remote from Corresponding Terminals" (FFI-P041) assigned to the assignee of this invention and incorporated herein by reference. This reference also includes a discussion of useful masking materials.

In one embodiment, first masking material layer 140 is deposited to a thickness of approximately 15-25 microns (μm). First masking material layer 140 is generally deposited to a thickness of the desired minimum spacing distance between the body of a subsequently-formed interconnection element and the surface of substrate 110. In the example where resiliency is desired, the thickness of first masking material layer 140 should be chosen such that potential "bottoming out" of the interconnection element is minimized.

In the embodiment where first masking material layer 140 is a photoresist, after patterning and developing the photoresist to have openings to contact pads or terminals 120 (or re-routed suitable openings), the photoresist layer may be subjected to a re-flow or other process to slope the edges of the openings. Creating sloped edges tends to reduce the number of stress points associated with an interconnection element formed through the openings. A re-flow process also introduces additional cross-linking in the photoresist which strengthens the photoresist to improve its properties for subsequent processing operations. In one example, the re-flow is accomplished in stages. At a first stage, structure 100 is brought to a temperature of approximately 105° C. then ramped to 110° C. and then ramped and retained for one hour at 120° C. In a second stage, the temperature is increased to 130° C. for another hour. It is to be appreciated that the temperature of the re-flow process can be adjusted higher or lower to adapt to subsequent process operations.

One alternative to a re-flow process is to slope the edges of the openings in first masking material layer 140 with a sputter or chemical etch.

FIG. 4 shows structure 100 after the introduction of activation layer 150. In one aspect, activation layer 150 is introduced to activate the exposed surfaces for introduction of subsequent material by way of an electroplating process. In one embodiment, activation layer 150 is formed by sputtering a material such as chromium/titanium-tungsten/gold (Cr/TiW/Au) layers. Titanium/gold (Ti/Au) or chromium/gold (Cr/Au) may also be utilized. An alternative to activating the surface structure 100 through sputter deposition is to chemically activate the surface. In one example, a palladium/tin (Pd/Sn) chloride bath introduces a film on the surface of structure 100 and electroless plating of palladium (Pd) is introduced to form a conductive film.

FIG. 5 shows structure 100 after the introduction and patterning of second masking material layer 160. In one aspect, second masking material layer 160 defines the shape of the body of a subsequently-formed interconnection element.

Figure 6:
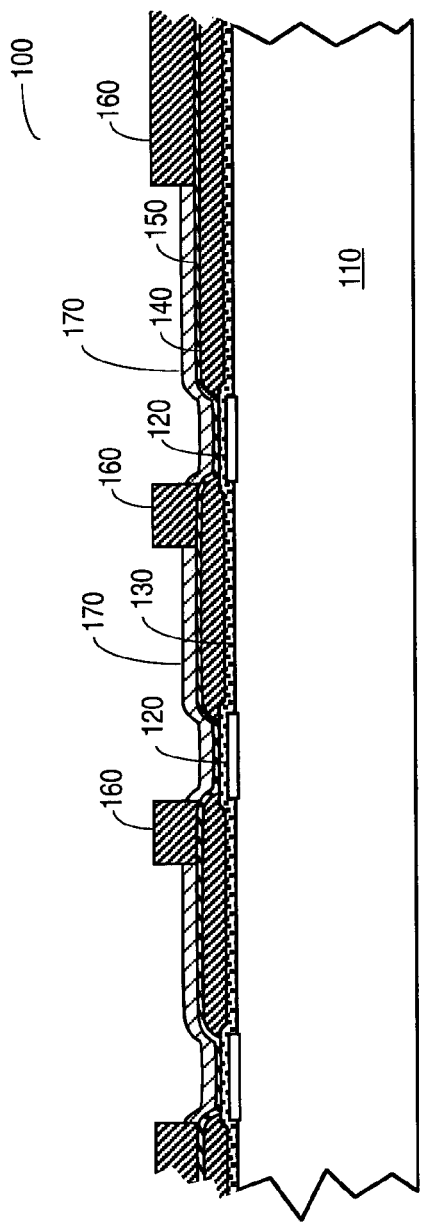
FIG. 6 shows the structure of FIG. 1 after the introduction of first element material in openings defined by the second masking material.

FIG. 6 shows structure 100 after the introduction of first element material 170. In one example, first element material 170 is a thermally-stable layer. One particular preferred material is a resilient alloy material of, for example, palladium/cobalt (Pd/Co) that generally will not change dimension upon exposure to temperatures to which it may be exposed, is generally inert, and is relatively easy to activate. Other possible materials for first element material 170 include nickel, tungsten, rhodium, iron, copper, silver, and aluminum, preferably in alloy form. In another embodiment, activation layer 150 may be used as the thermally stable layer.

In the embodiment described, wherein first element material 170 is Pd/Co material, first element material 170 is introduced through an electroplating process as known in the art. An introduction of first element material to a thickness of about 50 to 100 micro-inches (about 1-3 μm) is suitable. Alternatively, first element material 170 is made up of a plurality of layers, such as a first layer of a palladium/cobalt alloy and a second layer of palladium.

Figure 7:
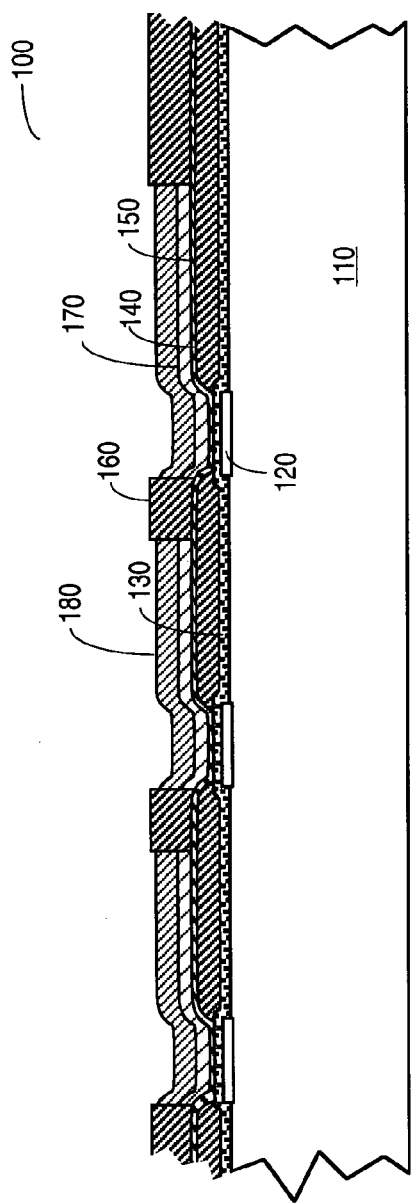
FIG. 7 shows the structure of FIG. 1 after the introduction of second element material over the first element material.

FIG. 7 shows structure 100 after the introduction of second element material 180 over the superior surface of first element material 170. In one aspect, second element material 180 includes a property such that its volume can be transformed from a first volume to a different second volume. The volume transformation may be reversible or irreversible. Irreversibility may be achieved, for example, through a re-crystallization of the material. One suitable material is a nickel/cobalt (Ni/Co) alloy in a 65/35 atomic percentage ratio with properties which optionally are tailored by plating with additives such as, for example, a brightener such as saccharin, napthalene-tri-sulfonic acid (NTSA), or other Class 1 and Class 2 brighteners, as well as levelers such as 2-butyne-1,4-diol and thiourea, and salts such as nickel bromide and nickel chloride. The use of additives in a suitable second element material is described in detail in copending U.S. patent application Ser. No. 09/217,589, filed Dec. 22, 1998, titled "Method of Making a Product with Improved Material Properties by Moderate Heat Treatment of a Metal Incorporating a Dilute Additive" (FFI-P036D1), assigned to the assignee of this invention and incorporated herein by reference in its entirety.

The introduced amount of first element material 170 and second element material 180 is selected, in one embodiment, to control the amount of deformation (e.g., deflection) of the interconnection element structure away from the substrate. As noted above, second element material 180 is transformed from a first volume to a second, different volume. In the case of Ni/Co, the volume change is irreversible and the second volume is smaller or different (in an x, y, z coordinate sense) than the first volume.

Figure 21:
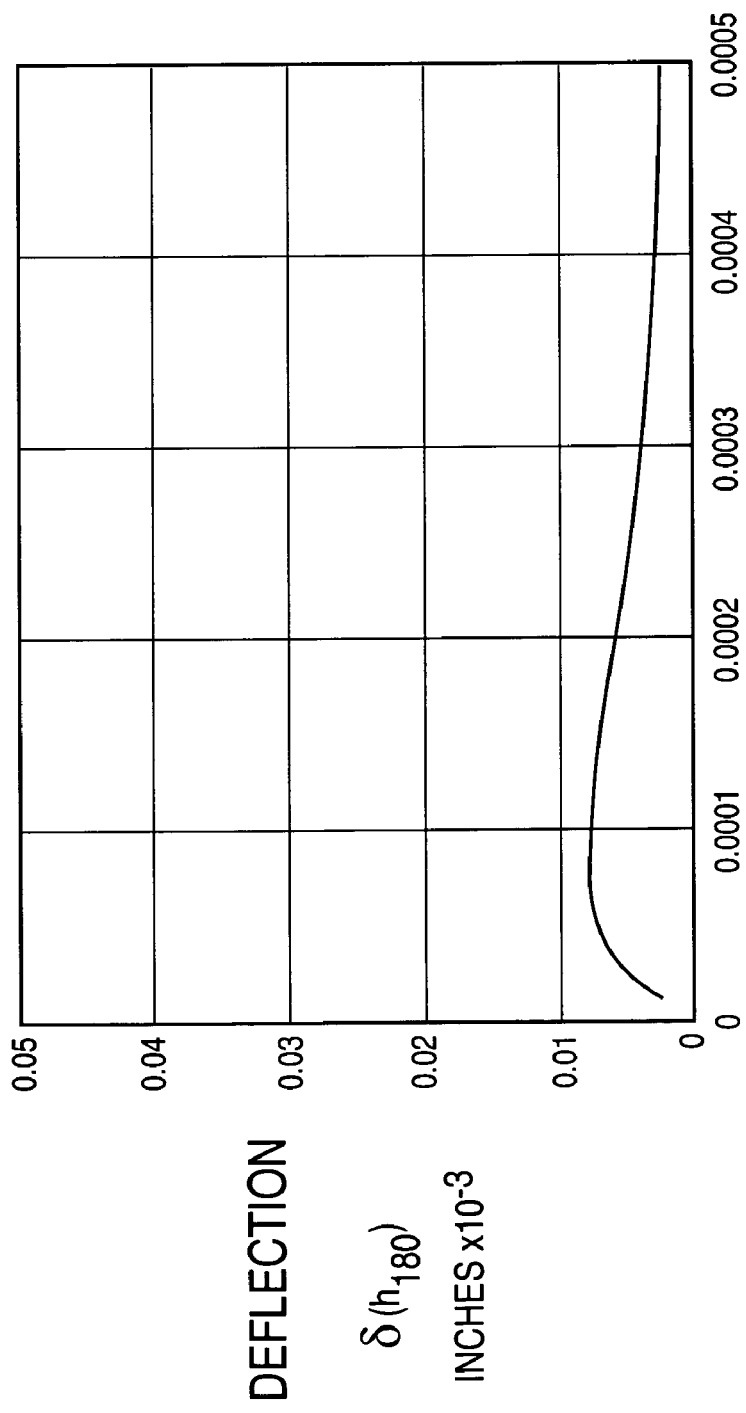
FIG. 21 shows a graphical representation of the deflection distance of an interconnection element of a first element material of palladium/cobalt alloy of 200 micro-inches (about 5 $\mu$m) and varying thickness of a second element material of nickel/cobalt alloy.

It has been determined that the ratio of thickness of first element material 170 to second element material 180, at least with first element material 170 of Pd/Co and second element material 180 of Ni/Co, is important for a chosen deflection. FIG. 21 shows the amount of deflection ($\delta(h_{180})$) in thousandths of an inch of an interconnection element of a cantilever beam having first element material 170 of Pd/Co and a thickness of 200 micro-inches (about 5 microns) and varying thicknesses of second element material 180 of Ni/Co according to the relation:

$$\delta(h_{180}) = \frac{\varepsilon \cdot l^2}{\left[\frac{(h_{170} + h_{180})^3}{6 h_{170} \cdot h_{180}} + \frac{h_{170} + h_{180}}{2}\right]}$$

wherein $\varepsilon$ is the percentage of shrinkage, l is the length of the interconnection element beam, $h_{170}$ is the thickness of first element material 170, and $h_{180}$ is the thickness of second element material 180. In this example, the interconnection element is a rectangular beam of length of approximately 40 mils (about 1000 μm). For first element material 170 of 200 micro-inches (about 5 μm), the thickness of second element material 180 may range from approximately 125 to 250 micro-inches (about 3-6 μm) of Ni/Co to yield a deflection distance ($\delta_2(h_{180})$) on deformation of approximately 0.008 inches or 8 mils (about 200 μm). Thus, in this example, the ratio of first element material 170 to second element material 180 may vary between about 1.6 to 1 to about 0.8 to 1. Less of additional second element material 180 will produce less deflection in this example. Varying the amount of first element material 170 may dramatically affect the deflection distance.

Selecting a first element material 170 thickness that allows for a range of thickness of second element material 180 alleviates some concern of the exactitude of a given deposition, since so long as the final structure is within the calculated ratio with a reasonable tolerance, a desired deflection should be realized. Thus, concerns over plating thickness uniformity or optimizing a thickness of an electroplated structure (such as by chemical-mechanical or mechanical polish) may be reduced or avoided. In the latter case, if such optimization is desired, a polish may be suitable provided such polish is compatible with the scale of the optimization, e.g., polishing a few micro-inches (less than 1 μm).

The above discussion described the transformation of second element material as a thermal transformation. The transformation is believed to be a result of a reorientation of the crystalline structure that makes up the second element material. It is to be appreciated that the volume of a suitable second element material may also be changed by other external events, such as increased pressure or the introduction of radiation such as ion-beam, electron-beam, infrared or ultra-violet radiation.

In the above discussion, first element material 170 comprises a Pd/Co alloy and second element material 180, a Ni/Co alloy overlying first element material 170. Alternatively, assuming the same orientation, first element material 170 may constitute Ni/Co alloy and second element material 180 Pd/Co alloy.

In one embodiment, first and second element materials 170 and 180 are introduced such that stress varies through the composite beam element 185, with the stress becoming increasingly tensile in the direction away from the substrate. In one case, first element material 170 comprises a Ni/Co alloy that when introduced has a stress that ranges from tensile to compressive. In an introduction process including plating, additives (such as saccharin) may be added to the plating bath to increase the compressive stress of Ni/Co as desired. Second element material 180 comprises a Pd/Co alloy that when introduced has a stress that is more tensile than that of first element 170. Sufficient tensile stress is inherent in a plated Pd/Co alloy but additional stress may be introduced through additives as known in the art. In a preferred embodiment, the stress in first element material 170 is compressive and the stress in second element material 180 is tensile. Amounts of first element material 170 and second element material 180 on the order of approximately 0.04 to 20 mils (about 1 to 500 μm) are suitable. Suitable thickness ratios may be experimentally determined.

Following the introduction and patterning of first element material 170 and second element material 180, structure 100 is heated, in one example, to 40°-100° C. for a period of time sufficient to relax first element material 170 of a Ni/Co. The moderate heating of Ni/Co causes the material to, it is believed, creep to a more relaxed form. Creep in a material is defined generally as the time-dependent part of strain resulting from stress.

At the elevated temperature, first element material 170 creeps under the tensile stress exerted by second element material 180. This causes interconnection element 185 to deform (e.g., deflect away from the surface of substrate 110) and reduces the magnitude of the stress in the first and second element materials 170 and 180. Thus stress relaxation can be considered the driving force for the deformation.

Figure 8:
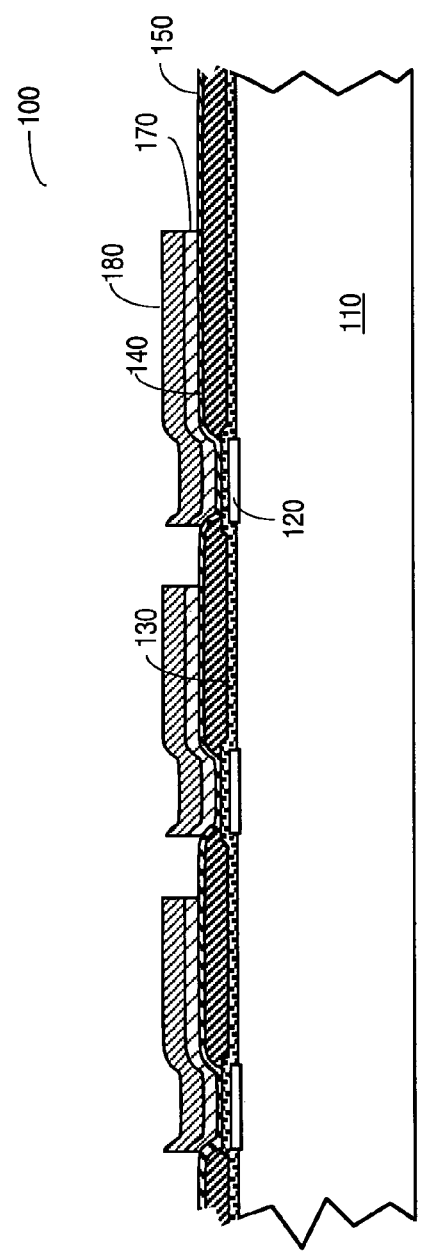
FIG. 8 shows the structure of FIG. 1 after the removal of the second masking material.
Figure 9:
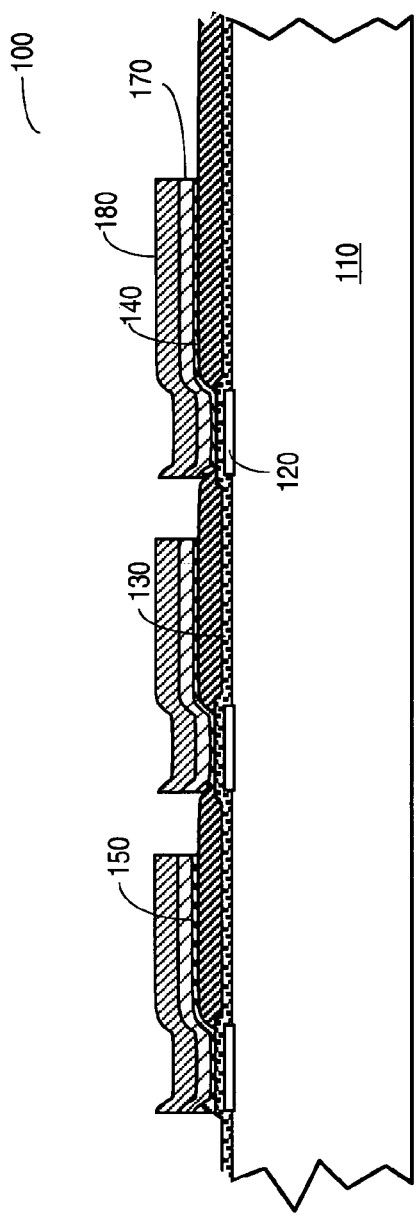
FIG. 9 shows the structure of FIG. 1 after the removal of exposed adhesion layer material.

FIG. 8 shows structure 100 after the removal of second masking material layer 160. In the example where second masking material layer 160 is a photoresist, the removal of second masking material layer 160 may be accomplished with an oxygen plasma etch (e.g., oxygen ashing). Other methods of removing second masking material layer 160 include, but are not limited to, laser ablation and wet chemical etching. Once second masking material layer 160 is removed, activation layer 150 is removed in those areas previously protected by second masking material layer 160. Activation layer 150 may be removed, for example, by a chemical or sputter etch as known in the art. FIG. 9 shows structure 100 after the removal of activation layer 150 in exposed areas.

Figure 10:
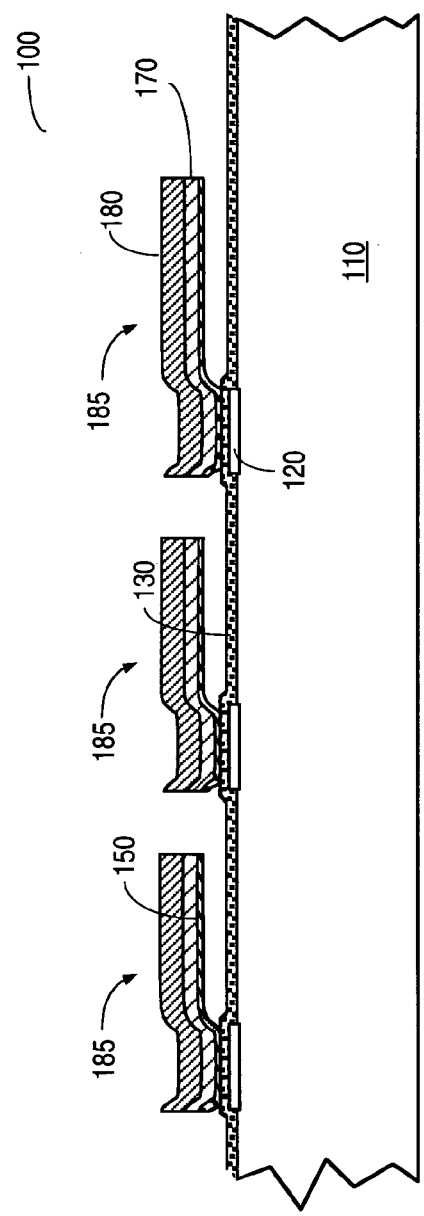
FIG. 10 shows the structure of FIG. 1 after the removal of the first masking material.

FIG. 10 shows structure 100 after the removal of first masking material layer 140. In the example where first masking material layer 140 is a photoresist, first masking material layer 140 may be suitably removed by various methods including an oxygen plasma etch, laser ablation, and wet chemical etching. Once removed, FIG. 10 shows substrate 110 having a plurality of interconnection elements 185 formed on a surface thereof.

Figure 11:
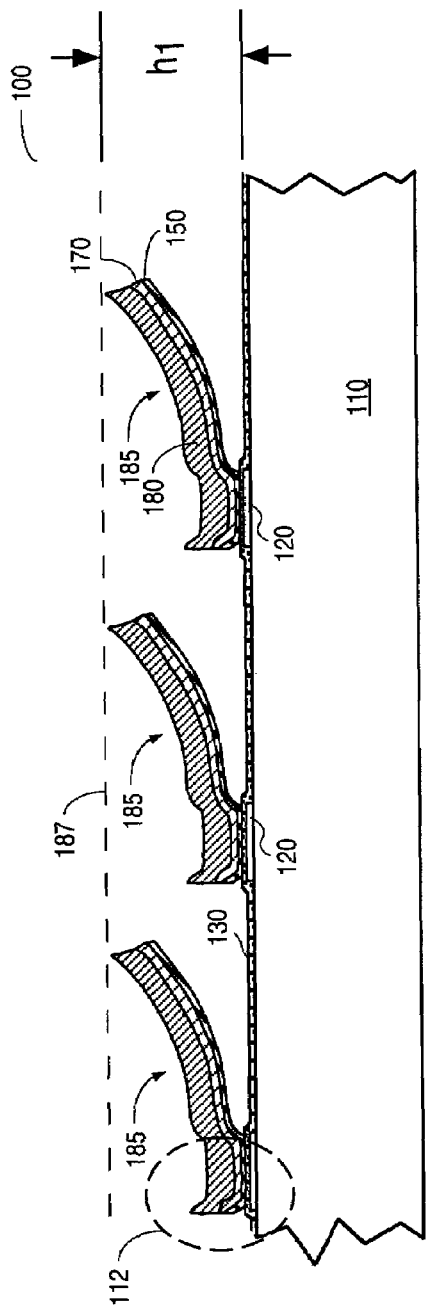
FIG. 11 shows the structure of FIG. 1 after inducing a volumetric change in the second element material.

FIG. 11 shows structure 100 after subjecting the structure generally to a thermal treatment to induce a transformation of one or both of first element material 170 and second element material 180. In the embodiment illustrated, the transformation is a volume transformation of second element material 180. The volume transformation proceeds, in one embodiment, to at least 90 percent completion and preferably 90-95 percent completion. The volume transformation of second element material 180 may be estimated by determining the linear coefficient of thermal expansion of the material. In one example, a second element material of nickel/cobalt deposited to a thickness of about 125 to 175 micro-inches (about 3-4 μm) will experience a linear change of about 0.2 percent upon heat treatment at 310° C. for ten minutes. Such linear change causes the volume to shrink while the volume of first element material 170, in one embodiment, remains relatively constant. The volume change causes the free end of the interconnection element to bend toward its secured base. A suitable curvature measured by a distance, $h_1$, from the surface of substrate 110 is, for example, approximately 6 to 8 mils (150-200 μm).

As illustrated in FIG. 11, the volume transformation of second element material 180 will modify the shape of interconnection element 185. In other words, the volume transformation of second element material 180 with the free end of interconnection element 185 tending to curve towards its base will similarly deform first element material 170 and activation layer 150 of interconnection element 185.

In some instances it may be desirable to limit the amount of curvature of second element material 180. Nevertheless, in one embodiment, it is desirable to achieve greater than or equal to 90 percent transformation or approximately 90-95 percent transformation to, for example, form a reliable interconnection element, e.g., reliable in the sense of deformation characteristics. In such cases, a curvature stop may be imposed over structure 100. Referring to FIG. 11, once interconnection element 185 curves away from substrate 110 and strikes curvature stop 187 (shown in ghost lines), the curvature stop will prevent further curvature away from the substrate (i.e., towards its secured base). In this manner, materials may be chosen having volume transformation properties much greater than might otherwise be chosen in the absence of curvature stop 187. For example, in order to introduce a plurality of interconnection elements on substrate 110, each of similar form and having a deflection distance, $h_1$, of about 8 mils (about 200 μm), the materials (e.g., first element material 170 and second element material 180) may be chosen of a type and amount such that the inherent deflection distance on, for example, thermal transformation is greater than 8 mils (e.g., 10-12 mils (about 250-300 μm)). Curvature stop 187, such as planar substrate may be placed at a distance of about 8 mils (about 200 μm) from the surface of substrate 110 to limit the deflection distance of the interconnection elements during transformation. Thus, where curvature stop 187 limits, for example, a z-axis deformation (deflection), the interconnection elements may still deform in x- and y-coordinate planes. The final interconnection elements will consistently have a height of about 8 mils (about 200 μm) from the surface of substrate 110.

Heretofore, the discussion has focused on a second element material that overlies a first element material and undergoes a transformation to transform to a smaller volume or to a different stress level and cause the free end of the interconnection element to curve away from the substrate. It is to be appreciated that other configurations may achieve similar results. For example, the second element material may underlie the first element material and have a property such that thermal transformation of the second element material will increase the volume of the material. In such case, similar curvature of the interconnection away from the substrate should be achieved. Likewise, a first element material may be selected such that it undergoes a volume transformation compared with a second element material having a relatively constant volume. Other configurations such as where both materials undergo a volume transformation or have different thermal expansion properties will behave similarly as will shape memory alloys (SMAs).

Figure 12:
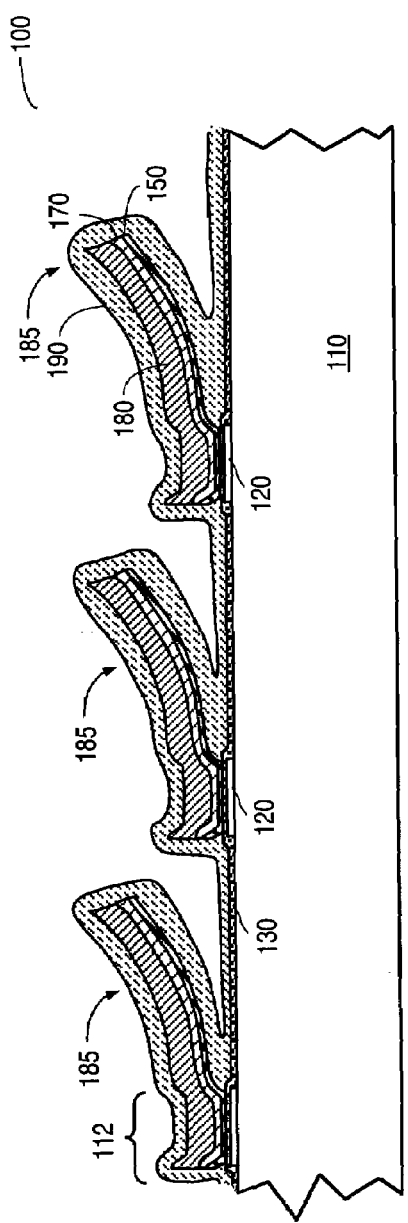
FIG. 12 shows the structure of FIG. 1 after the conformal deposition of a third masking material.

FIG. 12 shows structure 100 after the deposition of third masking material layer 190 conformally over substrate 110. A suitable thickness for third masking material layer 190 is about 0.3-1.5 mils (about 8 to 30 μm). In one embodiment, third masking material layer 190 is selected such that the conformal deposition will provide adequate masking of the entire portion of the superior surface of substrate 110 as well as coverage over interconnection element 185. In certain instances, the structural stability of interconnection element 185 is not sufficient to sustain a masking material layer deposited, for example, by spin-coating. Additional deposition techniques known in the art can be considered for this application. CVD or PECVD (plasma enhanced CVD) may be particularly useful for deposition. Other deposition techniques, such as sputter deposition are also not generally suitable for providing sufficient edge or surface coverage. Many introduction techniques will not mask any of the underside of interconnection element 185 nor the surface of substrate 110 nor shorting layer 130 where interconnection element 185 inhibits such introduction.

In one aspect, a positive electrophoretic resist is introduced as third masking material layer 190. Generally, an electrophoretic resist is an electro-deposited photoresist in which charged particles on the order of 1000 to 2000 angstroms (Å) are introduced in a uniform coating over a conductive surface. A suitable positive electrophoretic resist is Electro Image®, commercially available from PPG Industries of Pittsburgh, Pa. A second alternative is applying positive photoresist by spray-on method that will not damage the composite interconnection element. In either case, third masking material layer 190 is chosen, in one aspect, to have a thickness sufficient to define an additional layer substantially over the interconnection element as well as provide sufficient (in one embodiment, total) masking of interconnection element 185 such that additional interconnection materials will be introduced only onto an exposed area of interconnection element 185 and not over the surface of substrate 110 (e.g., not under interconnection element 185).

FIG. 13 shows structure 100 being exposed to open an area over a superior surface of the composite interconnection elements. In the embodiment illustrated, mask 200 is aligned over structure 100 having openings 210 corresponding with the superior surfaces of interconnection elements 185. In this embodiment, developing proceeds like a conventional positive photoresist. After developing, third masking material layer 190 will remain in all areas except the superior surface of the interconnection element 185. FIG. 14 illustrates the structure after development.

FIG. 15 shows structure 100 after the introduction of third element material 220 over interconnection element 185. In one embodiment, third element material 220 is a conductive material of, for example, a nickel alloy such as nickel-cobalt (e.g., 70 percent nickel-30 percent cobalt) possibly with an additive such as discussed in detail in co-pending, commonly-assigned U.S. patent application Ser. No. 09/217,589, filed Dec. 22, 1998, titled "Method of Making a Product with Improved Material Properties by Moderate Heat Treatment of a Metal Incorporating a Dilute Additive" (FFI-P036D1), and the corresponding PCT Application No. WO99/14404, published Mar. 25, 1999, which is incorporated herein by reference that provides increased spring force to interconnection element 185 (i.e., a "spring material"). In general, third element material 220 is introduced to a thickness suitable for increasing the spring constant of interconnection element 185. In one embodiment, third element material 220 is introduced to a thickness of, for example, about 1 mil (about 25 μm) to account for more than 90 percent of the body of interconnection element 185. Collectively, interconnection element 185 including third element material 220 define an interconnection element having a spring constant and a measurable resiliency greater than interconnection element 185 without third element material 220 (e.g., the spring constant generally depending in part on the dimensions of the interconnection element). In embodiments of interconnection elements useful in making electrical connections with, for example, contact pads or terminals of electronic components fabricated according to current technology, a spring constant of about 0.2 gram-force per mil or greater is suitable. It is to be appreciated that the desired spring constant may vary according to the desired application such as spring constants between about 0.01 and 10 gram-force per mil and preferably about 0.01 and 2 gram-force per mil. These parameters are only illustrative as one skilled in the art can make very thin or very thick structures with a wide range of spring constants.

It is to be appreciated that interconnection element 185 may already possess the desired spring constant, even a spring constant between about 0.01 and 10 gram-force per mil, rendering the inclusion of additional spring material unnecessary. For example, in the embodiment described above where the deformation of the interconnection element was brought about by relaxing the stress of the material (e.g., to reduce the magnitude of stress in first element material 170 and second element material 180), a sufficient amount of spring material, such as, for example, 0.5 to 1 mil (about 12 to 25 μm) of first element material 170 may be introduced, eliminating the need to introduce more spring material at this point.

In the embodiment where third element material 220 is a nickel alloy, such as nickel-cobalt, third element material 220 may be deposited by several deposition techniques, including but not limited to, electroplating, chemical vapor deposition, sputter deposition, and electroless plating. In one example, third element material 220 is deposited through an electroplating process. Third element material 220 is typically applied in the form of a commercially available electroplate solution or bath. Next, a current is applied between interconnection element 185 and an anode of an electroplating cell (not shown). Negative charge build-up on interconnection element 185 causes metal ions in the electroplating solution to be reduced to a metallic state, coating third element material 220 on interconnection element 185.

In certain instances involving electrolytic introduction of materials it may not be desirable to introduce through plating third element material 220 onto second element material 180 of an untreated Ni/Co alloy. Nickel or a Ni/Co alloy is generally not a good receiving surface for a plating process because of its tendency to oxidize. Techniques to improve nickel's or Ni/Co alloy's receiving properties include introducing (e.g., plating) a thin layer of copper (Cu), on the order of 10-100 micro-inches (about 3 µm) to second element material 180 immediately after the introduction of second element material 180 (e.g., prior to a significant amount of oxidation of the Ni/Co). Alternatively, after introducing second element material 180, interconnection element 185 may be placed in a bath of hydrochloric acid (HCl), a "strike bath", to activate the surface of the Ni/Co alloy, then third element material 220 may be introduced.

FIG. 16 shows structure 100 after the optional introduction of contact material 230 on the surface of third element material 220. In one example, contact material 230 reduces the resistivity of third element material 220 and provides contact metallurgy to the interconnection structure that is formed. Suitable contact materials include, but are not limited to, gold (Au), palladium (Pd), rhodium (Rh), and silver (Ag), and their alloys. In one embodiment, contact material 230 is introduced to a thickness of approximately 30 micro-inches (about 0.75 µm) to the surface of third element material 220.

FIG. 17 shows structure 100 after removal of third masking material layer 190. In the embodiment where third masking material layer 190 is a photoresist, third masking material layer 190 may be removed using conventional methods, such as plasma etching (e.g., oxygen ashing), laser ablation, or wet chemical etching. After the removal of third masking material layer 190, interconnection element 185 having a free-standing portion is formed on substrate 110. In the embodiment described, interconnection element 185 is a composite interconnection element comprised of activation layer 150, first element material 170, second element material 180, third element material 220, and contact material 230. At this point, structure 100 may be subjected to a heat treatment to improve the properties of interconnection elements 185. Such a heat treatment is described in detail in copending U.S. patent application Ser. No. 09/217,589, filed Dec. 22, 1998, titled "Method of Making a Product with Improved Material Properties by Moderate Heat Treatment of a Metal Incorporating a Dilute Additive" (FFI-P036D1) and assigned to assignee of this application, including a moderate heat treatment of, for example, 350° C. for ten minutes or 300° C. for 60 minutes for improving the properties of a Ni—Co alloy. As noted in the referenced document, different heat treatment schedules may be appropriate for different materials. Also, at this point, exposed portions of shorting layer 130 are removed using methods such as plasma etching (e.g., oxygen ashing), laser ablation, or wet chemical etching. Alternatively, shorting layer 130 may be patterned, at this point, into appropriate traces via a solvent, etching agent, or mechanical means.

FIG. 18 shows structure 100 after the introduction of travel stop material 240 over and around the structure. Travel stop material 240 is introduced to limit the travel of the composite interconnection element when making contact with, for example, a contact pad or terminal of an electronic component. In one embodiment, referring to FIG. 17, the height, $h_2$, of the tip of the composite interconnection element from the surface of substrate 110 is approximately 5-15 mils (about 250-400 µm). The desired amount of deflection for interconnection element 185 may be determined to be approximately 3 mils (about 75 µm). Thus, in one embodiment, travel stop material 240 is deposited to a thickness of approximately 2-12 mils (about 50-300 µm) to provide a height, $h_2$, of interconnection element 185 over travel stop material 240 of approximately 3 mils (about 75 µm). In one embodiment, travel stop material 240 is a non-conductive material such as a photoimageable material such as SU-8, which is a negative photoresist, commercially available from MicroChem Corporation of Newton, Mass. Other material for travel stop material 240 includes silicon nitride or silicon oxynitride or Probelec® from Ciba Specialty Chemicals (Basel, Switzerland, www.cibasc.com). A detailed discussion of suitable travel stop configurations and their uses is presented in co-pending, commonly-assigned U.S. patent application Ser. No. 09/114,586, filed Jul. 13, 1998, titled "Interconnected Assemblies and Methods" (FFI-P056), and corresponding PCT Application No. US99/00322, filed Jan. 4, 1999, which are incorporated herein by reference.

Figure 19:
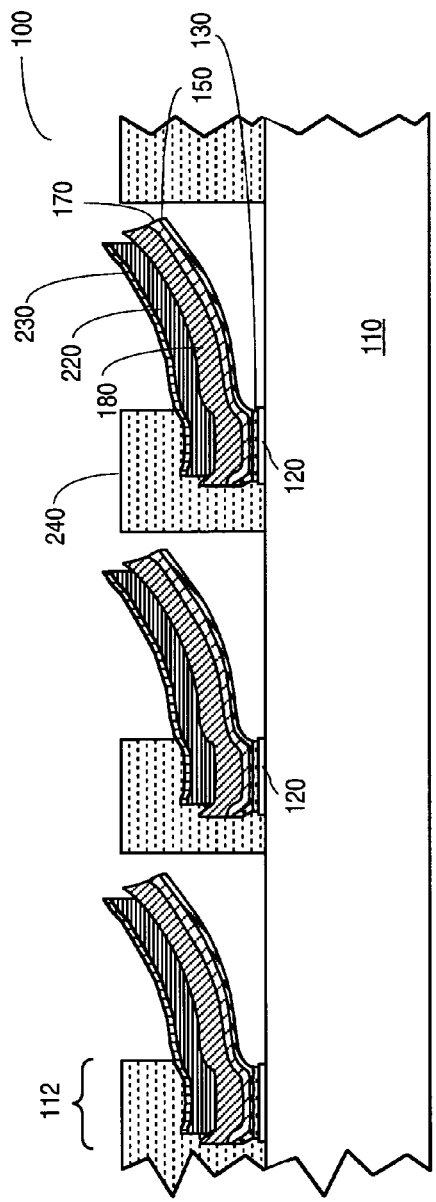
FIG. 19 shows the structure of FIG. 1 after patterning the travel stop material.

After the proper amount of travel stop material 240 is introduced over substrate 110, travel stop material 240 is patterned. In the example of a negative photoresist, travel stop material 240 is exposed through a mask such that an area around anchor portion 112 is exposed. Because travel stop material 240 is a negative photoresist, those areas that did not receive an exposure due to the mask will be developed to remove the photoresist (and the exposed portions of the photoresist will remain). FIG. 19 shows structure 100 after patterning travel stop material 240 over a portion of substrate 110 including anchor portion 112 of interconnection elements 185. In this embodiment, travel stop material 240 will allow the deflection of interconnection elements 185 towards substrate 110 with some limitation. For example, when a second electronic component is directed towards substrate 110, the electronic component will be stopped by travel stop material 240.

Figure 20:
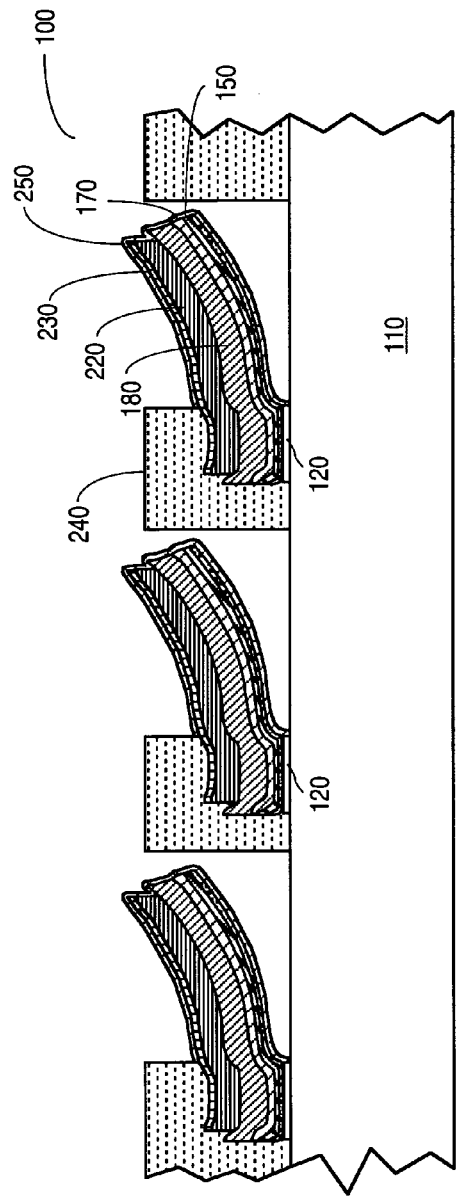
FIG. 20 shows the structure of FIG. 1 after introduction of a second contact material.

FIG. 20 shows interconnection element 185 having an overcoating of contact material 250, such as electroless gold (Au) coated to a few micro-inches (about 1-10 µm). This can improve the electrical conduction properties (e.g., lower the resistance) of the interconnection element and give additional corrosion resistance. It is to be appreciated that coating 250 is optional in this embodiment.

In the embodiment described, interconnection element 185 is a composite interconnection element. It is to be appreciated that the formation of interconnection element 185 of the core of first element material 170 and second element material 180 may be sufficient for certain applications and the introduction of additional resilient material (e.g., third element material 220) is unnecessary. Such an interconnection element may be defined possibly with an over-coating of contact material (e.g., Au). At the same time, it is also to be appreciated that additional element materials may be added beyond third element material 220 to, for example, increase the resiliency of the interconnection elements. In this manner, process steps similar to those described with the introduction of third element material 220 may be employed. In those instances, concerns of damaging the interconnection element in the application of additional masking material layer(s) are generally not as significant so more traditional forms of masking material may be utilized.

FIGS. 22-27 illustrate an additional embodiment of forming an interconnection element according to the invention, starting from the structure illustrated in FIG. 6 showing first element material 170 overlying activation layer 150 patterned according to the pattern established by second masking material layer 160. In one example, first element material 170 is a thermally-stable material such as a Pd/Co alloy. In FIG. 22, second masking material layer 160 is removed, for example, by an oxygen plasma etch (e.g., oxygen ashing), wet chemical etching, or laser ablation.

FIG. 23 shows structure 100 after the introduction of shape memory alloy (SMA) material 380. SMAs are groups of metallic materials that demonstrate the ability to return to some previously defined shape or size when subjected to the appropriate procedure, typically a thermal procedure. Such materials can recover substantial strain or generate significant force upon changing shape. Certain nickel-titanium alloys and copper-based alloys meet this criteria. The copper-based alloys (such as copper-zinc alloys) are particularly suitable for plating operations.

In one example, SMA material 380 is stretched from a memory state or shape to a martinsite (low-temperature) state, i.e., in this example, the martinsite state is a stretched state. In this martinsite state, SMA material 380 that is a sheet has greater dimensions, for example, in its length and width than in a memory state.

As shown in FIG. 23, SMA material 380 is laminated over first element material 170 using, for example, an adhesive such as an epoxy or a eutectic method such as with a gold eutectic. Then, as shown in FIG. 24, laminated SMA material 380 in its martinsite state is patterned, using, for example, photolithography techniques, into beams overlying patterned first element material 170. Next, as shown in FIG. 25, first masking material layer 140 is removed by a suitable technique to reveal a plurality of interconnection elements of first element material 170 each having a beam of SMA material 380 laminated thereto, a cantilever beam of each structure separated from the surface of substrate 110 by a height, $h_3$. In an insert, FIG. 25 shows an exploded side view of a single beam of SMA material 380, having a length, a, and a thickness, t, in its martinsite or stressed state.

Figure 26:
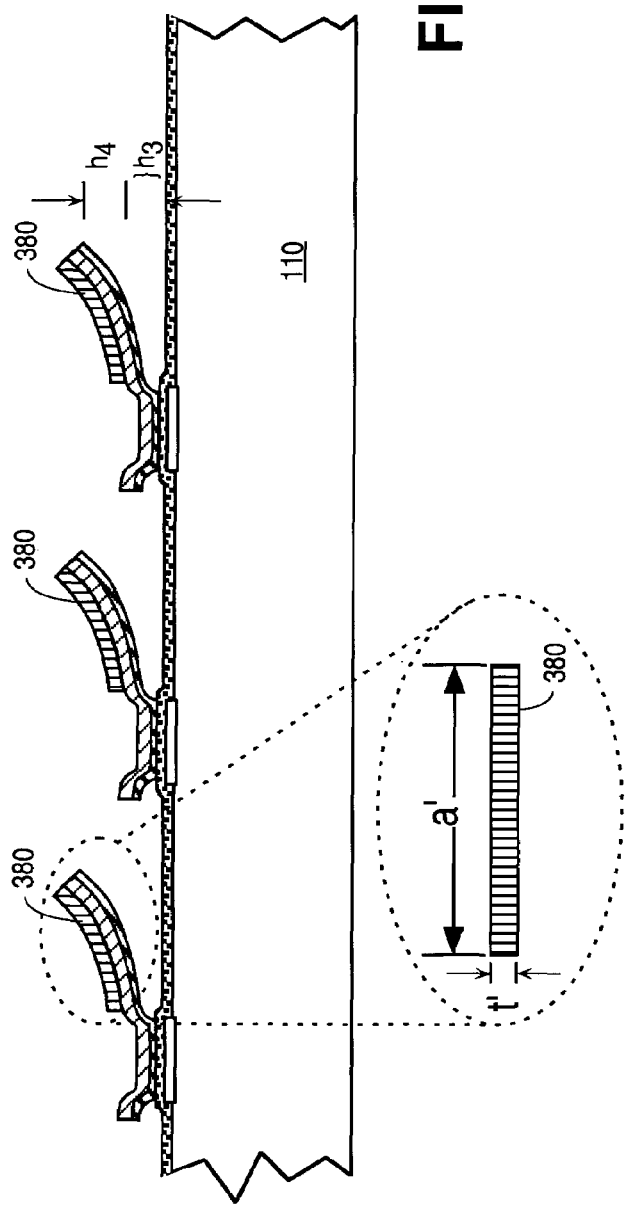
FIG. 26 shows the structure of FIG. 22 after the transformation of the SMA material to its memory state.

FIG. 26 shows a structure after a heat treatment to, in one sense, transition SMA material 380 from its martinsite state to a high-temperature austensite phase or memory state. FIG. 26 includes an insert of SMA material 380 in its memory state, having a length, a', and thickness, t'. In a memory state, SMA material 380 has different dimensions than in its martinsite state. The insert for FIG. 26 shows SMA material 380 in its memory state having length (a'<a) and a width less than a width in a martinsite or stressed state.

To bring about the transition of SMA material 380 to its austensite phase (memory state), the structure is subjected to a heat treatment at a temperature above the transition temperature of SMA material 380 for the austensite phase. Above the transition temperature, SMA material 380 will deform back towards its memory state thereby shrinking the film. Through bimorphic or bi-metallic action, the end of the composite beam of SMA material 380 and first element material 170 will, in this instance, bend toward its base. In this manner, a desired curvature of an interconnection element may be achieved, such as a height, $h_4$ of approximately 8 mils (about 200 µm) from the surface of substrate 110. In some instances, it may be desirable to limit the amount of curvature of the interconnection element by, for example, a curvature stop such as described above with reference to FIG. 11 and the accompanying text.

In the above embodiment, the transition of SMA material 380 to its memory state is a thermal transformation. It is to be appreciated that it may be possible to incorporate alternative external stimuli (e.g., pressure changes or radiation) to bring about the transformation. In the case of a thermal transformation at elevated temperature, the temperature treatment that brought about such thermal transformation may be extended to anneal first element material 170 to modify the stress of the material and increase the stability of the deformed material.

Figure 27:
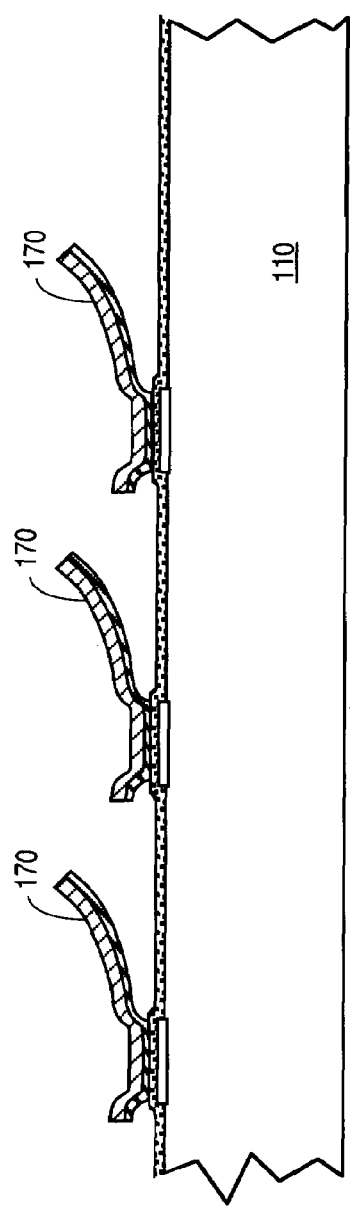
FIG. 27 shows the structure of FIG. 22 after the removal of the SMA material.

Following the transition of SMA material 380 to its memory state and the deformation of first element material 170, in one example, SMA material 380 may be removed, leaving an interconnection element of first element material 170 (and activation layer 150). In one instance, SMA material 380 may be removed directly by way of a plasma or chemical etch or laser ablation. Alternatively, where an adhesive is utilized between SMA material 380 and first element material 170, the adhesive may be dissolved to separate SMA material 380 from the first element material 170. FIG. 27 shows the resultant structure wherein SMA material 380 is removed leaving first interconnection element of first element material 170.

In still another embodiment, SMA material can be left on. The stiffness of the SMA material will contribute to the overall spring constant, giving a spring constant which is high enough, without the addition of more material.

Separately, a thickness of SMA material can be selected which will deflect a relatively thick beam (material 170). Such a thick beam can be conditioned to retain this new shape and the SMA material can be removed, such that the resulting structure will have a sufficiently high spring constant.

Figure 28:
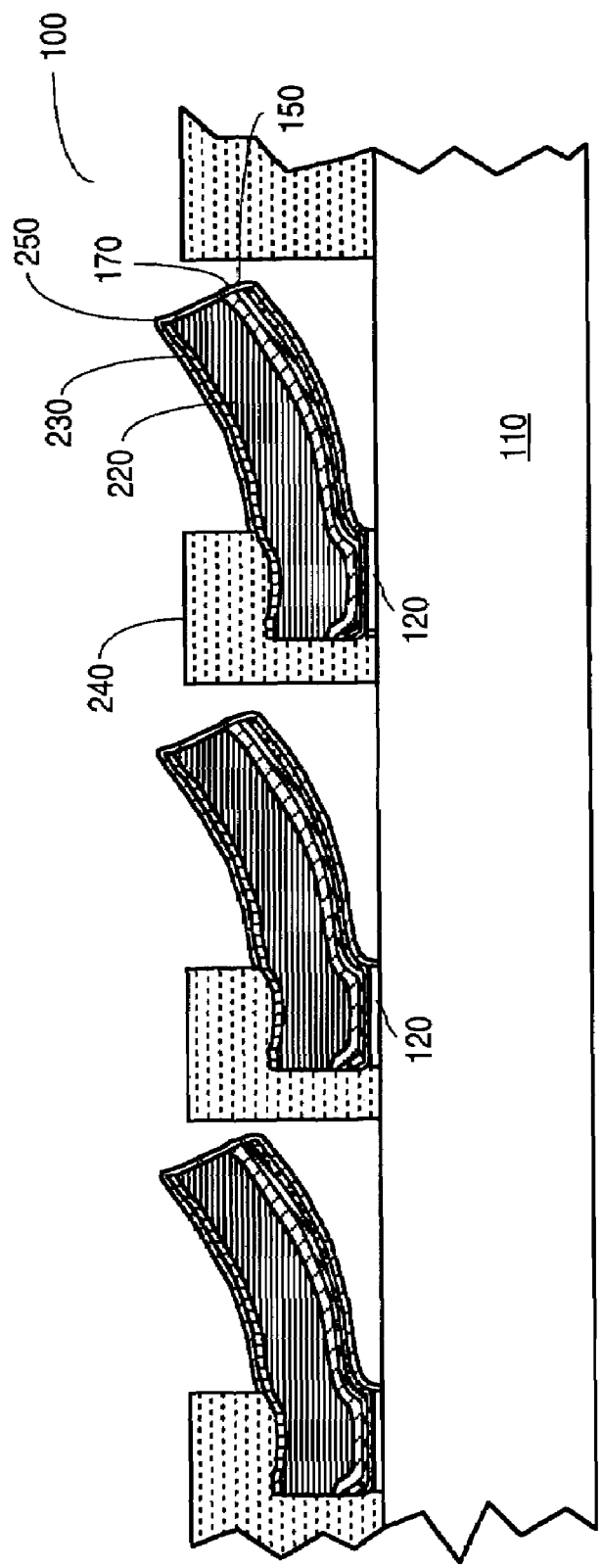
FIG. 28 shows the structure of FIG. 22 after the introduction of probe material and contact material to each interconnection element and the patterning of travel stop material.

FIG. 28 shows one final structure formed according to this embodiment. The structure is similar to FIG. 20, and shows a cross-sectional side view of three interconnection elements formed on the surface of substrate 110. Each interconnection element includes first element material 170 and third element material 220 of, for example, a nickel alloy such Ni/Co (e.g., 70 percent Ni-30 percent Co), possibly with an additive, that provides increased spring force to the interconnection element (i.e., a "spring material"). In general, third element material 220 is introduced to a thickness suitable for increasing the spring constant of the interconnection element to a suitable level. Thicknesses on the order of about 1 mil (about 25 µm) which accounts for more than 90 percent of the body of the interconnection element are suitable according to current technology. FIG. 28 also shows optional contact material 230 of, for example, gold (Au), palladium (Pd), rhodium (Rh), and silver (Ag), and their alloys introduced to a thickness of approximately 30 micro-inches (about 0.75 µm). Also shown in this illustration is optional contact material 250, such as electroless gold (Au) coated to a few micro-inches (about 1-10 µm). Finally, FIG. 28 shows optional travel stop material 240 that may be used to, in one instance, limit the deflection of the interconnection element. The introduction of each of these materials is similar to that described above with reference to FIGS. 12-20 and the accompanying text.

The preceding description illustrates, among other aspects, interconnection elements and the fabrication of interconnection elements with a desired shape and spring constant. The fabrication techniques take advantage of the behavior of certain metallic materials with transformable properties to deform in response to an external stimulus (e.g., heat) to form the improved interconnection elements.

The interconnection elements described herein are suitable for many uses including, but not limited to employment with an electronic component to make temporary or permanent contact, or temporary and then permanent contact to the electronic component. Such contact may be utilized in manufacturing flows in, for example, the formation of integrated circuit chips or dies. For example, the interconnection elements of the invention may form temporary contacts to bond pads of a singulated or unsingulated chip or die as part of "burn-in" and/or functional testing of the chip or die to link the chip or die to a testing device. An example of a permanent connection is the use of the interconnection elements of the invention, possibly including the interconnection elements utilized to make temporary connection while testing a chip or die, to electrically link the chip or die to external system components (e.g., a PCB) through, for example, a package.

Manufacturing flows are described in detail, for example, in commonly-assigned U.S. Pat. No. 5,829,128, which is incorporated herein by reference. The interconnection elements of the invention may be utilized in testing equipment such as extending as probes from a substrate, such as a probe card or a space transformer of a probe card for testing electronic components as described in U.S. Pat. No. 5,829,128 and commonly-assigned U.S. Pat. No. 5,974,662, also incorporated herein by reference. The interconnection elements of the invention may also be utilized in interposer applications to connect two electronic components as described in U.S. Pat. No. 5,829,128.

U.S. Pat. No. 5,829,128 further describes interconnection elements connected directly to a semiconductor die (e.g., to bond pads) eliminating the need for a corresponding package. The interconnection elements described herein are likewise suitable for such an application. Commonly-assigned U.S. Pat. No. 5,772,451, incorporated herein by reference, describes socket applications suitable for the interconnection applications described herein permitting an electronic component (e.g., a semiconductor package) to be releasably mounted to a circuit board. One example is interconnection elements coupled to a first substrate are coupled, for example, through pressure connections, to corresponding ones of contact nodes on a second substrate (e.g., a support substrate). The second contact nodes include external connection points to couple the collective assembly (e.g., first and second substrates) to corresponding third contact nodes on a third substrate such as a circuit board.

In the preceding detailed description, the invention is described with reference to specific embodiments thereof. It will, however, be evident that various modifications and changes may be made thereto without departing from the broader spirit and scope of the invention as set forth in the claims. The specification and drawings are, accordingly, to be regarded in an illustrative rather than a restrictive sense.

What is claimed is:

1. An interconnection element comprising:
   a first element material adapted to be coupled at a first end to a substrate, a second end of the first element being releasable from the substrate; and
   a second different element material coupled to the first element material,
   wherein one of the first element material and the second element material is transformable in response to an external stimulus such that, while the second end of the first element material is released from the substrate, the interconnection element maintains a first geometric shape before application of the external stimulus and changes to a second geometric shape in response to the application of the external stimulus, and the second geometric shape is different than the first geometric shape, and
   wherein a transformation of the one of the first element material or the second element material by the external stimulus is permanent such that removal of the external stimulus does not result in the interconnection element returning to the first geometric shape.

2. The interconnection element of claim 1, wherein the interconnection element is of a size suitable for directly contacting a semiconductor device.

3. The interconnection element of claim 1, wherein the external stimulus comprises heat.

4. The interconnection element of claim 1, wherein each of the first element material and the second element material is transformable in response to an external stimulus.

5. The interconnection element of claim 1, wherein at least one of the first element material and the second element material are introduced by plating.

6. The interconnection element of claim 1, wherein at least one of the first element material and the second element material are introduced by sputtering.

7. The interconnection element of claim 1, wherein at least one of the first element material and the second element material are introduced by electroless plating.

8. The interconnection element of claim 1, wherein the first element material comprises palladium or its alloy.

9. The interconnection element of claim 1, wherein the one of the first element material and the second element material changes shape to a predetermined shape in response to the external stimulus.

10. The interconnection element of claim 9, wherein the second element material changes shape to a predetermined shape in response to the external stimulus, and the second element material overlies the first element material.

11. The interconnection element of claim 1, wherein application of the external stimulus to the one of the first element material or the second element material changes a volume of the one of the first element material or the second element material.

12. The interconnection element of claim 11, wherein the second element material overlies the first element material and, in response to the external stimulus, the volume of the second element material increases.

13. The interconnection element of claim 11, wherein application of the external stimulus to the one of the first element material or the second element material decreases a volume of the one of the first element material or the second element material.

14. The interconnection element of claim 11, wherein the first element material is an alloy comprising palladium/cobalt and an activation layer comprises one of copper and nickel.

15. The interconnection element of claim 14, wherein the second element material further comprises nickel.

16. The interconnection element of claim 14, wherein the second element material comprises a nickel alloy.

17. The interconnection element of claim 1, wherein one of the first element material and the second element material comprises an inherent stress and the external stimulus reduces the inherent stress.

18. The interconnection element of claim 17, wherein the inherent stress comprises a tensile stress.

19. The interconnection element of claim 18, wherein the external stimulus comprises heat.

20. The interconnection element of claim 17, wherein the inherent stress comprises a compressive stress.

21. The interconnection element of claim 1, wherein the overall thickness of the interconnection element is between 1 and 500 μm.

22. The interconnection element of claim 1, wherein the overall thickness of the interconnection element is greater than 25 μm.

23. The interconnection element of claim 1, wherein the overall thickness of the interconnection element is about 28 μm.

24. The interconnection element of claim 1, wherein the first element material has a thickness between 1 and 3 μm.

25. The interconnection element of claim 1, wherein the first element material has a thickness of about 5 μm and the second element material has a thickness between about 3 and 6 μm.

26. The interconnection element of claim 1, wherein the first element material has a thickness between about 12 and 25 μm.

27. The interconnection element of claim 1, wherein the overall thickness of the interconnection element is greater than 1 μm.

28. The interconnection element of claim 1, wherein the one of the first element material and the second element material changes size to a predetermined size in response to the external stimulus.

29. The interconnection element of claim 28, wherein the second element material changes size to a predetermined size in response to the external stimulus, and the second element material overlies the first element material.

30. The interconnection element of claim 1, wherein the interconnection element is electrically conductive, and while in the second geometric shape, a free end of the interconnection element is disposed to contact an electronic component and thereby provide an electrical connection between the substrate and the electronic component.

31. The interconnect element of claim 1, wherein one of the first element material and the second element material is a shape memory alloy.

32. The interconnect element of claim 1, wherein, in the first geometric shape, the interconnection element is substantially planar between a first portion of the first element material that includes the first end and a second portion of the first element material that includes the second end, and in the second geometric shape, the interconnection element comprises a curve between the first portion and the second portion.

33. The interconnect element of claim 1, wherein, in the first geometric shape, the interconnection element is substantially parallel to the substrate between a first portion of the first element material that includes the first end and a second portion of the first element material that includes the second end, and in the second geometric shape, the interconnection element curves away from the substrate between the first portion and the second portion.

\* \* \* \* \*